(12) United States Patent
Zammit et al.

(10) Patent No.: US 7,146,300 B2
(45) Date of Patent: Dec. 5, 2006

(54) METHOD OF CO-SIMULATING A DIGITAL CIRCUIT

(75) Inventors: Vincent Zammit, Sunnyvale, CA (US); Andrew Kay, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 714 days.

(21) Appl. No.: 10/014,831

(22) Filed: Dec. 11, 2001

(65) Prior Publication Data
US 2002/0083420 A1 Jun. 27, 2002

(30) Foreign Application Priority Data
Dec. 15, 2000 (GB) ................................ 0030735.5

(51) Int. Cl.
*G06G 7/62* (2006.01)
*G06F 9/45* (2006.01)
(52) U.S. Cl. .................... 703/13; 703/14; 717/126; 717/150; 717/160
(58) Field of Classification Search .............. 703/20, 703/21, 13, 14; 717/126, 150, 152, 160
See application file for complete search history.

(56) References Cited

U.S. PATENT DOCUMENTS

| | | | | | |
|---|---|---|---|---|---|
| 5,493,672 | A | * | 2/1996 | Lau et al. | 703/21 |
| 5,600,579 | A | * | 2/1997 | Steinmetz, Jr. | 703/13 |
| 5,870,585 | A | * | 2/1999 | Stapleton | 703/15 |
| 5,870,588 | A | * | 2/1999 | Rompaey et al. | 703/13 |
| 6,112,023 | A | * | 8/2000 | Dave et al. | 703/27 |
| 6,117,180 | A | * | 9/2000 | Dave et al. | 703/20 |
| 6,167,363 | A | * | 12/2000 | Stapleton | 703/14 |
| 6,178,542 | B1 | * | 1/2001 | Dave | 716/18 |
| 6,182,258 | B1 | * | 1/2001 | Hollander | 714/739 |
| 6,427,224 | B1 | * | 7/2002 | Devins et al. | 716/4 |

OTHER PUBLICATIONS

Michael Sipser, "Introduction to the Theory of Computer Science", 1997, PWS Publishing Company, pp. 171-173.*
Silbershatz, Galvin, and Gagne; "Operating System Concepts", 2002, John Wiley & Sons, Inc.; Sixth Edition, pp. 99-103, 153-156, 264-266.*
"Pentium(r) Pro Processor Performance Brief", Jun. 1997, Intel(r), pp. 1-23.*

* cited by examiner

*Primary Examiner*—Paul Rodriguez
*Assistant Examiner*—Jason Proctor
(74) *Attorney, Agent, or Firm*—Renner, Otto, Boisselle & Sklar, LLP

(57) ABSTRACT

A method is provided for co-simulating a digital circuit using a simulation engine (45) which communicates with one or more first programming languages by means of a foreign language interface and which communicates directly with one or more second programming language. At least one first model (2, 3) or at least one first part of the digital circuit is provided in at least one high-level hardware description language which supports concurrent processes communicating with each other. The at least one first model is converted (50, 51) to at least one software model in the at least one first language. At least one second model (4, 5, 6) of at least one second part of the digital circuit is provided in the at least one second language

17 Claims, 20 Drawing Sheets

METHOD OF CO-SIMULATING A DIGITAL CIRCUIT

BACKGROUND OF THE INVENTION

1. Field of the Invention

The present invention relates to a method of co-simulating a digital circuit. Such a method may be used as part of the design and manufacturing process of integrated circuits, for example of VLSI type.

2. Description of the Related Art

Non-trivial digital hardware circuits are usually designed using a synthesis-based approach where the circuit is described in a Hardware Description Language (HDL) and then synthesised into hardware using a synthesis tool. VHDL (for example as disclosed in IEEE Computer Society, "IEEE Standard VHDL Language Reference Manual" New York. USA, March 1988. IEEE Std 1076-1987 and IEEE Computer Society, "IEEE Standard VHDL Language Reference Manual" New York, USA, June 1994. IEEE Std 1076-1993) and Verilog HDL (for example as disclosed in IEEE computer Society, "IEEE Standard Hardware Description Language Based on the Verilog Hardware Description Language." New York, USA 1996. IEEE Std 1364-1995) are commonly used hardware description languages. However, as circuit complexity continues to increase, there is a trend to use higher-level hardware description languages, usually based on programming languages such as C (for example as disclosed in, Brian W. Kernighan and Dennis M. Ritchie, "The C Programming Language. Prentice-Hall, USA, second edition, 1988") and C++ (for example as disclosed in Bjarne Stroustrup, "The C++ programming language." Addison-Wesley series in computer science, Addison-Wesley, Reading, Mass., USA) instead of register transfers.

Such languages allow the design of hardware in terms of algorithms. High-level synthesis tools (for example as disclosed in Daniel Gajski, Nikil Dutt, Allen Wu, and Steve Lin, "High-Level Synthesis, introduction to Chip and System Design." Kluwer Academic Publishers, Boston/Dordrecht/London, 1992) are then used to generate lower level HDL descriptions from the given algorithm-level descriptions. Similarly to software design, the use of a high-level language usually results in shorter design times.

In some systems, the high-level HDL used is simply a well known programming language. For Instance System C (for example as disclosed in Synopsys Inc. "Overview of the Open System C initiative," datasheet available on the internet from www.systemc.org,1999) uses C++ as a system description language. In other cases, a programming language with extensions relevant to hardware design is used. Examples of such systems include the Tangrarn system (as disclosed in K. van Berkel, J. Kessel, M. Roncken, R. Saeijs, and F. Schalij, "The VLSI-Programming Language Tangram and its Translation into Handshake Circuits", Proceeding of the European Design Automation Conference (EDAC 91), pages 384–389, Amsterdam, February 1991, IEEE, IEEE Computer Society Press and Kees van Berkel, "Handshake Circuits", volume 5 of Cambridge International Series on Parallel Computation, Cambridge University Press, Cambridge, UK, 1993) and the Bach system (as disclosed in Akihisa Yamada, Koichi Nishida, Ryoji Sakurai Andrew Kay, Toshio Nomura and Takashi Kambe, ""Hardware synthesis with the BACH system"" International Symposium on Circuits and Systems, 1999 and in GB 231724S).

The language used by the Bach hardware compiler extends the C language with (amongst other features) constructs for expressing explicit parallelism and synchronous communication. The Bach language is based on the Communicating Sequential Processes (CSP) model, which is disclosed in C. A. R. Hoare, "Communicating sequential processes." Communications of the ACM, 21 (8): 666–677, August 1978 and C. A. R. Hoare, "Communicating Sequential Processes." Prentice-Hall International, Englewood Cliffs (N.J.), USA, 1990, first edition published in 1985 by Prentice-Hall and which is a model of computation which supports concurrency. The Tangram language is also based on CSP.

Another important advantage of using a high-level HDL is faster simulation speeds due to the level of abstraction of the design description. Very fast simulation speeds can also be achieved by compilation based simulation (see for example L. T. Wang, N. E. Hoover, E. H. Porter, and J. J. Zasio. "SSIM: A software levelised compiled-code simulator", Proceeding of the $24^{th}$ Design Automation Conference, pages 2–8, IEEE, IEEE Computer Society Press, 1987) where the hardware description is compiled into an executable format rather than interpreted by the simulation engine. In the case of using a sequential programming language (such as C++) as a HDL, a hardware description can be compiled and simulated simply by using a standard compiler for the particular language. If the programming language used is extended with hardware design relevant features such as parallelism, then a hardware description can be converted into a sequential program before being compiled. For example, in the Tangram system, a hardware description can be converted into a C program as disclosed in Kees van Berkel, "Handshake Circuits," volume 5 of Cambridge University Press, Cambridge, UK, 1993. Also, JP 1121939 describes a simple mechanism for converting CSP features into a sequential language.

In systems comprising of one or more components, every component may be described in a language chosen for its particular strengths and expressiveness. For example. a hardware description language is used for hardware components and a software programming language is used for software components. It is therefore very common that the components in a system are described in several languages. FIG. 4 of the accompanying drawings shows an example of such a system description. The complete system description comprises a plurality of component model descriptions which communicate with each other. The Bach C Language mentioned hereinbefore is used at 2 and 3 to provide descriptions of a demodulator component and an error correction decoder component. The VHDL language mentioned hereinbefore is used at 4 and 5 to describe a RAM (random access memory) component and a Fast Fourier Transform (FFT) component. The C Language is used at 6 to describe a test bench component.

Since the verification of such a system is an essential part of its design process, it is required that the verification, or simulation, is fast as a lot of simulation data may have to be processed. This simulation process is often referred to as co-simulation because of the heterogeneous nature of the system. The different system component models need to communicate with each other during co-simulation, and known methods, such as that disclosed in U.S. Pat. No. 5,335,191, can be used. One method for the co-simulation of a hardware component designed in a high-level HDL is to synthesise the hardware description into a lower-level HDL using a high-level synthesis tool or simulation engine 8 as illustrated in FIG. 2 of the accompanying drawings, and then co-simulate the low-level description using the hardware simulation tool. However, this method does not take advantage of the fact that a high-level description can be used for simulation, and has the following disadvantages:

(a) synthesis time overhead;
(b) slower simulation due to the use of a lower-level HDL;
(c) applicable only to synthesisable descriptions.

Hardware simulators presently available allow the simulation of models described in different HDLS, as well as foreign models, that is, models described using means other than the HDLS understood by the simulator. For instance, the latest standard of VHDL (for example as disclosed in IEEE Computer Society, "IEEE Standard VHDL Language Reference Manual," New York. USA, June 1994. IEEE Std 1076-1993) allows the specification of foreign entities. The Synopsys VSS simulator (as disclosed in Synopsys Inc. VSS Reference Manual. USA, 1998) provides a C Language Interface (CLI) (as disclosed in Synopsys Inc. VSS Interfaces Manual. USA. 1998) for the implementation of foreign entities using the C language. Similarly the Model Technology ModelSim simulator (as disclosed in Model Technology Inc. ModelSim SE/EE User's Manual. USA.1999) provides a Foreign Language Interface (FLI) for the same reason. The simulation engine described in David A. Burgoon. A mixed-language simulator for concurrent engineering. In The Proceedings for the 1998 International Verilog HDL Conference and VHDL International Users Forum, US, March 1998. IEEE Computer Society is also capable of co-simulating C models with lower level Verilog Models. These particular methods apply only when the high-level hardware is described in a sequential language such as C. Further, the C code must be written in a special stimulus-response fashion, which is not purely algorithmic.

SUMMARY OF THE INVENTION

According to a first aspect of the invention, there is provided a method of co-slmulating a digital circuit using a simulation engine which communicates with at least one first programming language by means of a foreign language interface and which communicates directly with at least one second programming or hardware description language, comprising the steps of:

(a) providing at least one first model of at least one first part of the digital circuit in at least one high-level hardware description language which supports concurrent processes communicating with each other;
(b) converting the at least one first model to at least one software model in the at least one first language;
(c) providing at least one second model of at least one second part of the digital circuit in the at least one second language; and
(d) applying the at least one software model in the at least one first language and the at least one second model in the at least one second language to the simulation engine.

A high-level or behavioural hardware description is a description of a hardware component which specifies only the behaviour of the component and does not specify its physical architecture, such as the logical, arithmetic and storage components of which it is constituted, the clock rate and its timing. The behaviour is usually given as an algorithm. A high-level or behavioural hardware description language is a language in which the high-level description of the hardware can be described. High-level or behavioural hardware synthesis or compilation is the process of generating a hardware low-level description from a high-level hardware description. Given a clock rate, this process infers the required logical, arithmetic and storage components, the signals connecting them, their timing and controlling logic.

The converting step (b) may comprise compiling the at least one first model in the at least one high-level hardware description language to the at least one software model in the at least one first language.

The at least one high-level hardware description language may be based on a communicating sequential processes model.

The at least one first part of the digital circuit may be represented in the at least one high-level hardware description language as a plurality of concurrent processes which communicate with each other and the converting step (b) may comprise converting the concurrent processes to a sequential software process. The software process may comprise at least one stimulus unit for detecting a predetermined stimulus and at least one response unit for providing a predetermined response in response to the at least one stimulus unit. At least one of the response units may comprise a process response unit for performing a desired behaviour of the at least one first part of the digital circuit. The desired behaviour may comprise a plurality of discrete processes triggered by a common event and the process response unit may comprise a scheduler for scheduling the discrete processes and a process handler for performing the discrete processes in accordance with the scheduling. The scheduler may: form a list of active unhandled processes having respective exit points: choose from the list a current process; and select an entry point for the current process.

At each exit point, the scheduler may choose from the list a further current process and may select a further entry point for the further current process.

The converting step (b) may comprise: generating, for at least one of the discrete processes, software code including a program loop having a jump instruction and a loop termination condition; analysing the loop termination condition to determine whether it is possibly non-terminating; and, if so replacing the jump instruction with an exit point.

At the exit point, the scheduler may place the at least one discrete process in the list of active unhandled processes with a new entry point.

According to a second aspect of the invention, there is provided a method of designing a digital circuit, comprising performing a method according to the first aspect of the invention, checking whether the result of the co-simulation is correct, checking whether the digital circuit is synthesisable, and generating a low-level hardware description of the digital circuit.

According to a third aspect of the invention, there is provided a method of manufacturing a digital circuit, comprising performing the method according to the second aspect of the invention and forming, from the low-level hardware description, an integrated circuit including the digital circuit.

According to a fourth aspect of the invention, there is provided an integrated circuit made by a method according to the third aspect of the invention.

According to a fifth aspect of the invention, there is provided an apparatus for performing a method according to the first or second aspect of the invention.

The apparatus may comprise a computer programmed by a computer program.

According to a sixth aspect of the invention, there is provided a computer program for an apparatus according to the fifth aspect of the invention.

According to a seventh aspect of the invention, there is provided a storage medium containing a program according to the sixth aspect of the invention.

In the present method, a high-level sequential description of a synchronous hardware model can be generated automatically from a high-level hardware description based on a concurrent model of computation. The model description can be compiled into executable code and can be co-simulated with other system components We therefore, achieve the advantages of both high-level HDL simulation and compilation based simulation for the co-simulation of a high-level hardware description with other system components.

An example of the use of this method is to co-simulate a hardware circuit described as an algorithm in a CSP-based high-level language with other system components during system design and development. For example, this method can be used for the fast co-simulation of hardware circuits described in the Bach C language with other system components. FIG. 1 of the accompanying drawings illustrates the Bach hardware design flow, where hardware is described in the Bach high-level language, and a low-level synthesisable hardware description is generated automatically. Since the hardware designer uses a high-level language instead of a lower level one (such as VHDL), the design process is much quicker and therefore cheaper than traditional hardware design processes. The use of the present method allows the co-simulation of the hardware component to be done at the algorithm-level and is therefore much faster than a co-simulation process where lower-level hardware descriptions are used. As a result, the time spent in hardware design is reduced.

The advantages of this method include:
(a) allowing the co-simulation of the hardware component to be done at the algorithm-level and therefore
  (i) the simulation is independent of the target architecture;
  (ii) the simulation is much faster than simulations at lower levels since the amount of detail that is simulated is much less.
(b) The component model can be compiled into the native code of the machine used for simulation from an algorithmic description. This approach offers very high simulation speeds.
(c) The generation of the hardware component model used for simulation does not require complex pre-computations and is therefore quite efficient.
(d) It is often desirable to co-simulate a hardware description with other system components during the early stages of hardware development, that is, before an efficient and fully synthesisable hardware description has been developed. Since the hardware description used for co-simulation does not need to be synthesised into lower level descriptions, this co-simulation method can be used during these early stages of the design flow.

The above factors all contribute to the advantages associated with high-level hardware (and system) design flow:
(A) quicker time-to-market,
(B) and the ability to explore a large design space and hence develop more efficient designs.

The invention will be further described, by way of example, with reference to the accompanying drawings.

DESCRIPTION OF THE PREFERRED EMBODIMENTS

The present method can take a textual description of a high-level hardware design and generate a component model that can communicate with a simulation engine. This makes use of a simulation engine and a means for the system component models to communicate with the simulation engine. An example of such means is described in U.S. Pat. No. 5,335,191. By using such communication means and a simulation engine, the present method allows high-level hardware designs to be co-simulated with other system components.

The high-level hardware description language is assumed to be based on a model of computation which considers concurrency (parallelism) and is therefore not purely sequential. Some embodiments make use of the Communicating Sequential Processes (CSP) model, but this method may be applied to any model of concurrency. A description based on the CSP model describes a parallel algorithm involving a number of sequential processes communicating with each other using synchronous channels. The parallelism is stated explicitly using a special language construct (typically the par or PAR construct). The synchronous communication is also stated explicitly in the sequential processes by the send (or !) and receive (or ?) constructs. The sequential processes can be structured using the usual constructs of an imperative programming language: sequential composition, conditionals and loops.

Figure 6:
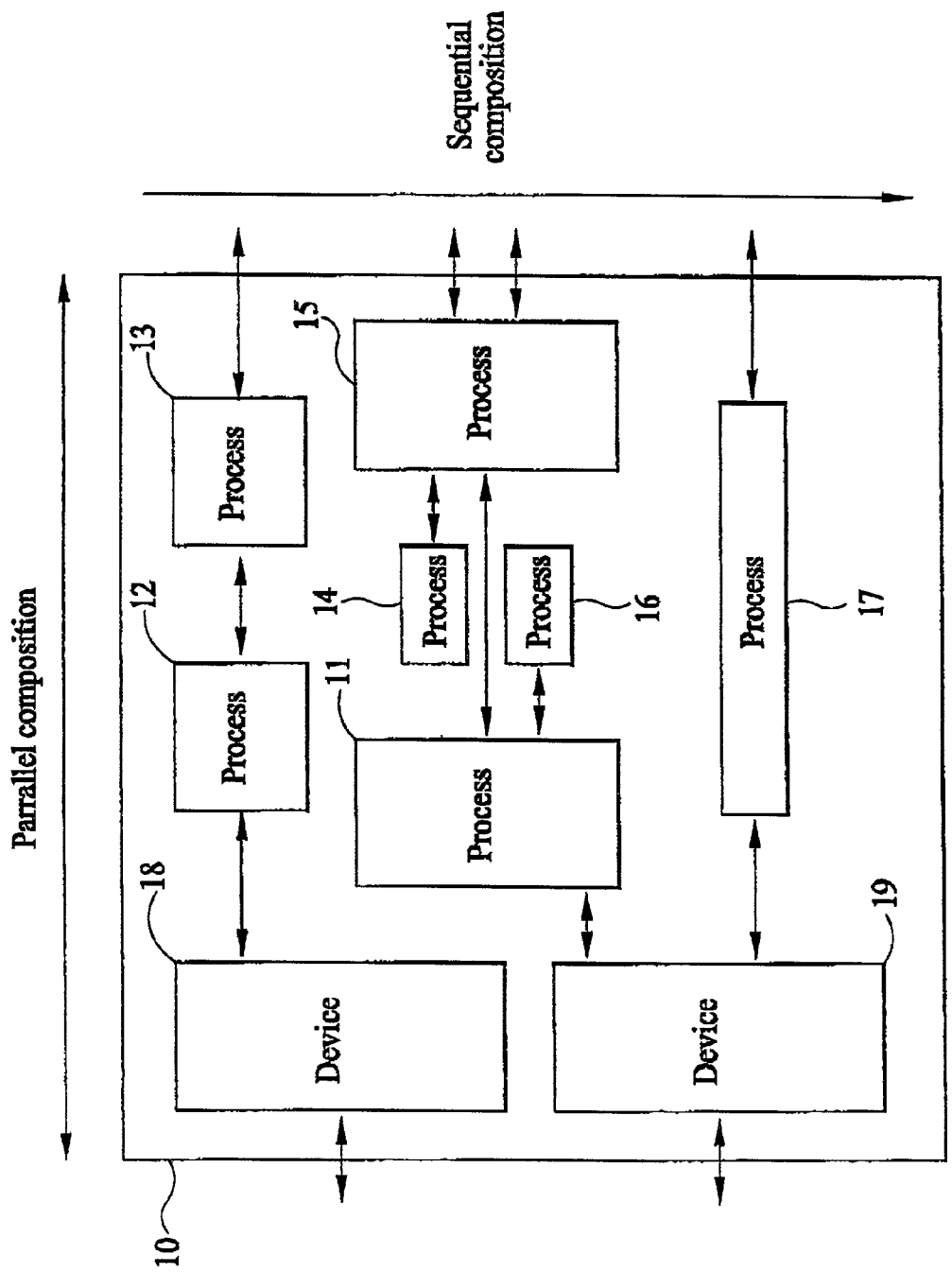
FIG. 6 shows a high-level model described as processes communicating together and with the environment and accessing internal or external devices.
Figure 7:
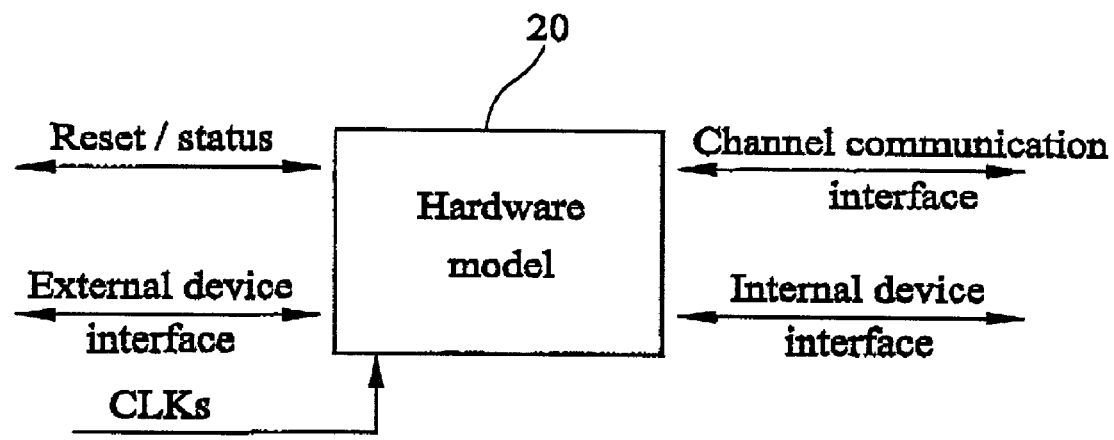
FIG. 7 shows the interface of the target hardware model, which is also the interface of the simulation model.

The CSP model is used to describe a hardware component which needs to communicate and react with its environment. This is done through synchronous communication using channels, or else by certain devices. The devices are memories: RAMs, ROMs and registers, and can be either internal (described in the CSP model) or else external (in the environment) FIG. 6 illustrates a hardware component 10 described as a CSP model structured as seven processes 11 to 17 communicating with each other and accessing internal and external devices 18, 19. FIG. 7 illustrates the interface of the low-level target hardware model 20 specified by the CSP-based high-level model. It is a synchronous circuit and includes ports for external clocks, initialisation, reporting status, synchronous external communication, and access for internal and external devices.

Figure 8:
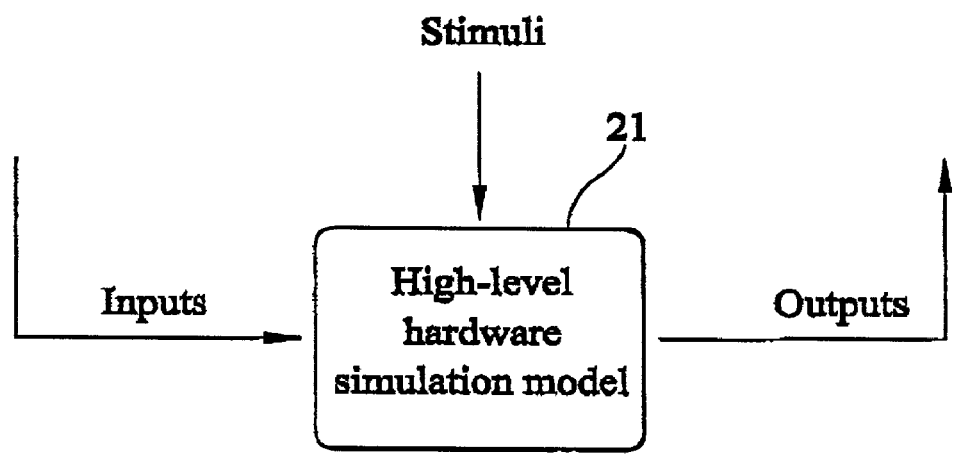
FIG. 8 shows the simulation model which processes the input values, returns output values and is stimulated by a number of stimuli.

The component model that is automatically constructed by this method for co-simulation (the simulation model) is described as a sequential algorithm which contains a number of communication instructions for asynchronous communication with the simulation engine. A number of the input communications are considered to be stimuli to the component model: they instruct the model to perform some action which basically consists of reading some input data, processing it, changing the internal state of the model, and sending some output data. FIG. 8 shows the external inputs and outputs of the simulation model 21.

Figure 12:
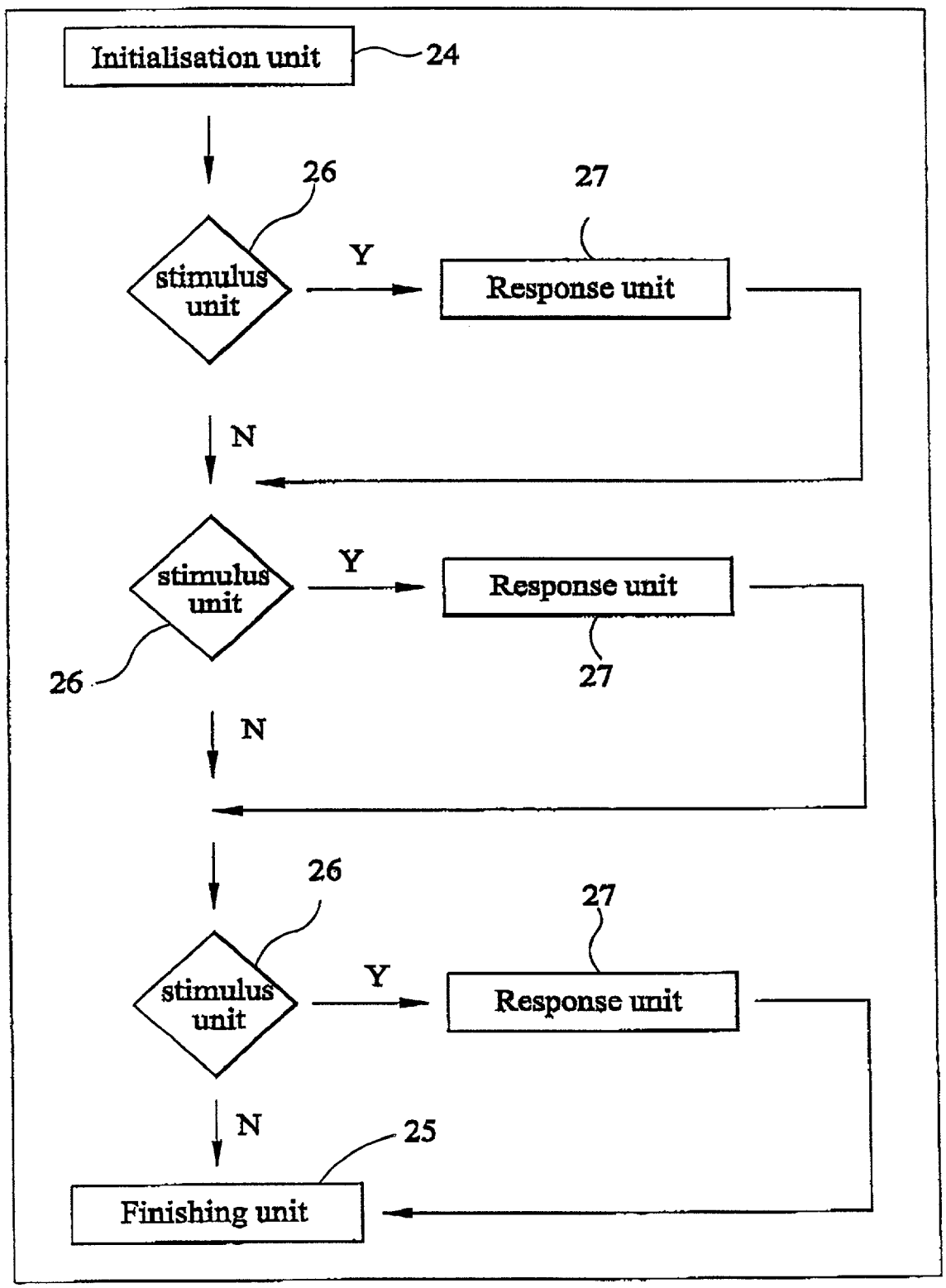
FIG. 12 illustrates the structure of the simulation model.

FIG. 12 shows the overall structure of the generated simulation model which comprises an initialisation unit 24, a finishing unit 25 and several stimulus units 26 and response units 27. There is a stimulus unit 26 for each type of input stimulus which the simulation model accepts The stimulus unit 26 decides whether to activate a corresponding response unit 27. The following are examples of response units:

(a) A reset response unit which sets the internal state of the model to its initial value. The corresponding stimulus is the active value of the reset port.

(b) Internal devices response units which handle the internal devices. These handle the representation of the registers, RAMs, ROMs, etc. and are stimulated by the values of the input ports for the case of asynchronous devices and by clock edges for the case of synchronous devices.

(c) Process response units which perform the actual behaviour described by the high-level hardware description and represent the processes of the high-level CSP model. Since the high-level model represents a synchronous circuit, the process response units are stimulated by clock edges. Because of the parallelism described by the high-level model, the process response unit includes a mechanism for scheduling the tasks representing the sequential processes.

The method by which the simulation model is generated from a textual description of the hardware component consists of the following steps:

(1) generate a simulation model description using a simulation model generator;

(2) compile the simulation model using a standard compiler.

The compiled simulation model can then be used by the simulation engine during co-simulation.

The structure of the Simulation Model Generator is similar to that of a compiler and comprises a parsing unit, a code processing and generation unit, and a code printing unit. The code processing and generation unit takes the internal representation of the parsed high-level model, and generates the internal representation of the simulation model. It comprises the following units:

(1) stimulus selectors which assign devices and processes to particular stimuli;

(2) response unit generators which generate the individual reset, internal devices and processes response unit from the given CSP hardware model;

(3) and an overall Code Generator which constructs the simulation model description from the individual response units.

The process response generation unit is the most significant Component of the Simulation Model Generator and is responsible for:

(a) sequentialising the parallel algorithm described by the CSP model;

(b) generating code for the synchronous channel communication;

(c) generating code for the access interface for external devices;

(d) assigning locality to the data of the CSP model. For instance, this unit decides whether certain data can be shared by all instances of the same model or not.

(e) generating a scheduler to take care of the parallelism described by the processes in the CSP model.

Figure 1:
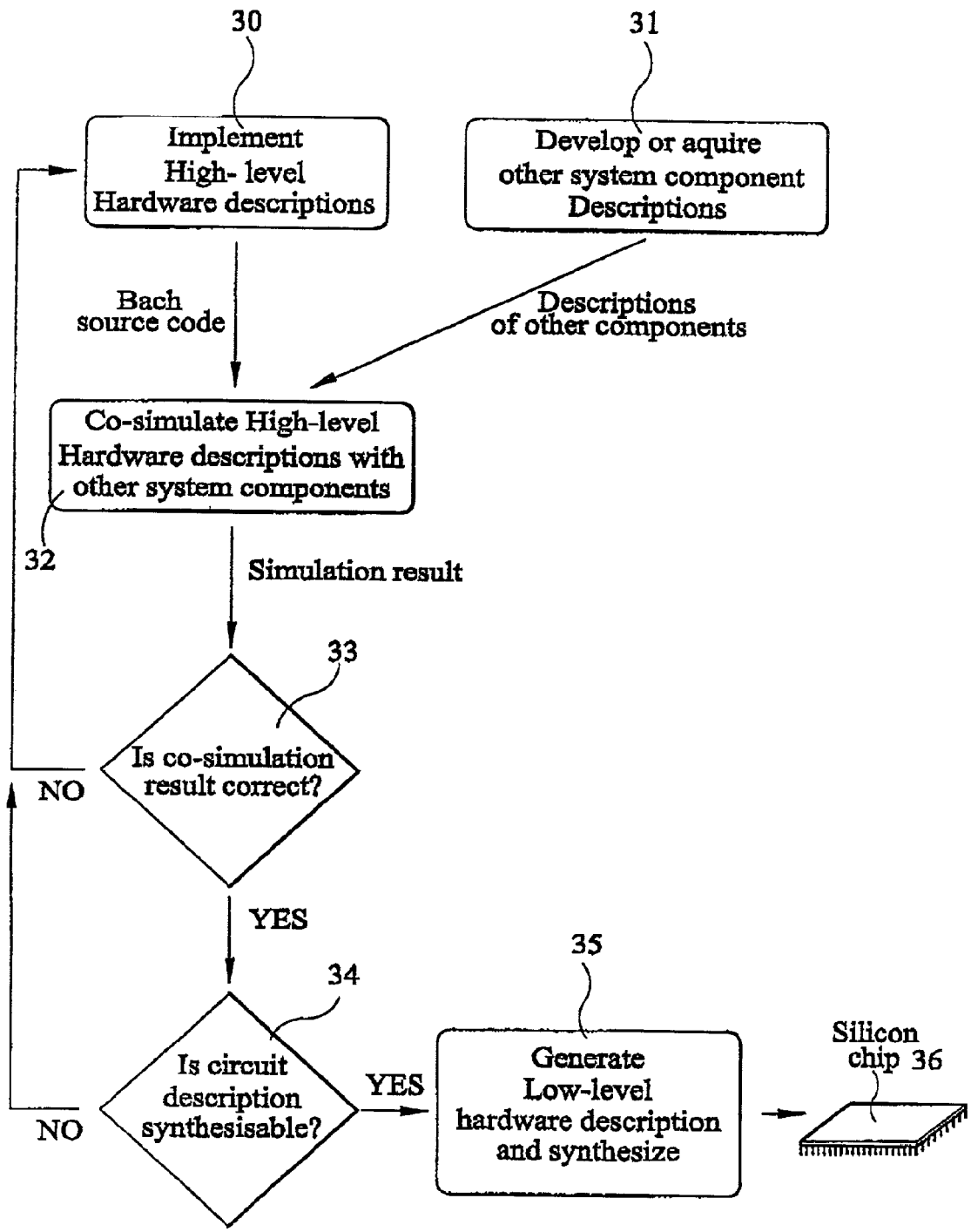
FIG. 1 illustrates the design flow of hardware using a high-level language and including a method of constituting an embodiment of the invention.
Figure 2:
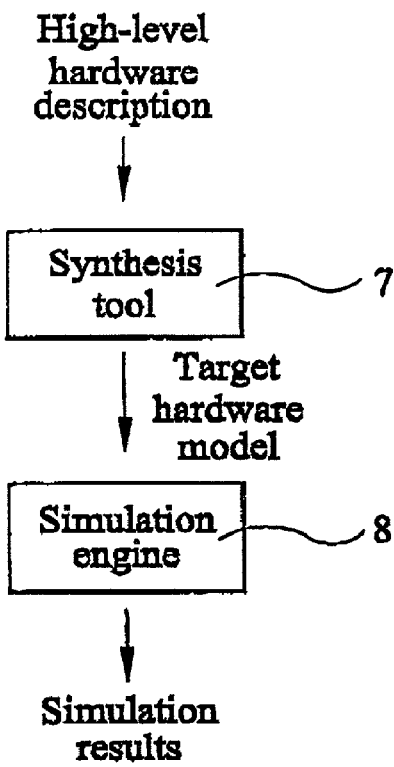
FIG. 2 illustrates a known method in which the high-level description is first used to generate a lower level target model which is then used for co-simulation.

The present method can be used in the simulation of a system description in which a number of the system components are described in a CSP-based high-level hardware description language. The design flow for such a system is shown in FIG. 1 where the co-simulation of the system components is an important procedure for verifying the behaviour of the system design.

High-level hardware descriptions are implemented at 30 and result in Bach source code. Other system components descriptions are developed or acquired at 31 and these, together with the Bach source code, are used at 32 to co-simulate the high level hardware descriptions with the other system components. At 33, the co-simulation result Is checked and, if it is not correct, the step 30 is repeated so as to change the high-level hardware descriptions. If this co-simulation result is correct, a test 34 determines whether the resulting circuit description is capable of being synthesised. If not, the control returns to the step 30. If the circuit description is synthesisable, a step 35 generates a low-level hardware description and performs the synthesis which ultimately results in the manufacture of an integrated circuit or silicon chip 36.

Figure 3:
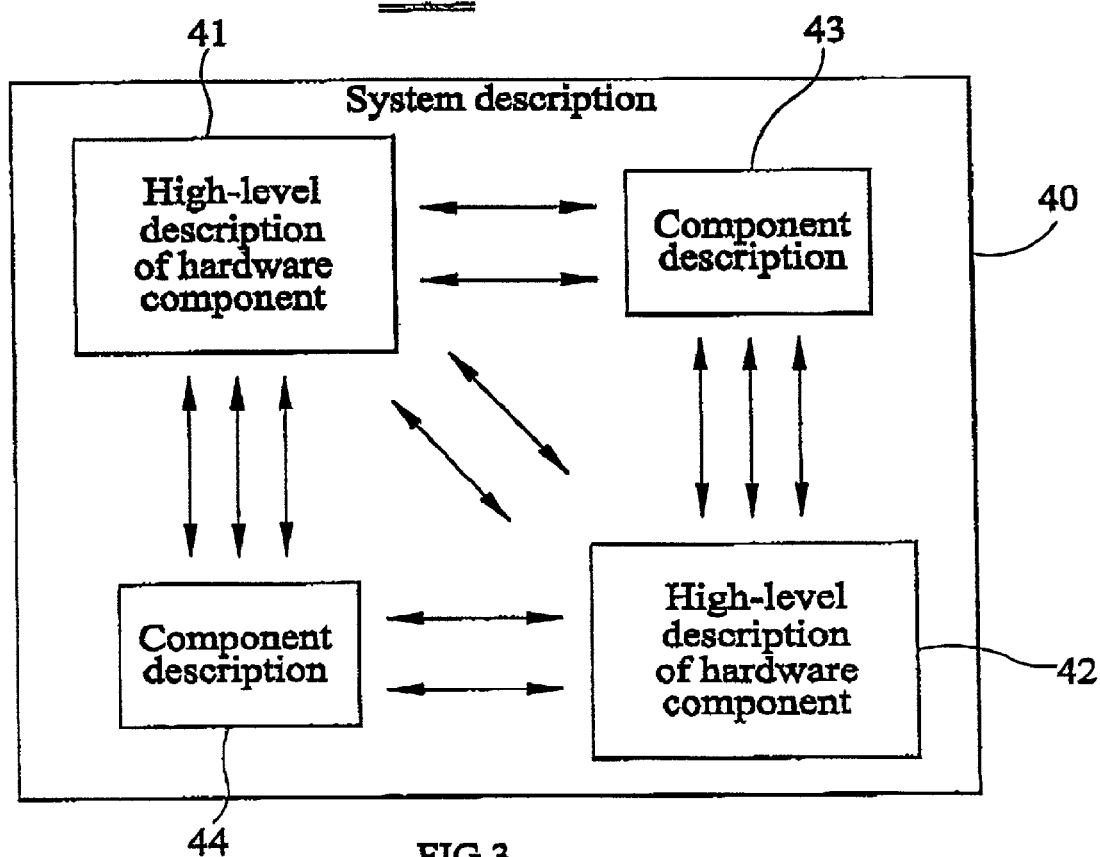
FIG. 3 shows a general view of a system description with component model descriptions communicating with each other and with some component models described in a high-level language.

FIG. 3 illustrates an example of the system description 40. The system description comprises a number of components 41 to 44 described at different levels of abstraction, with some of the component models 41, 42 described in a high-level language.

Figure 5:
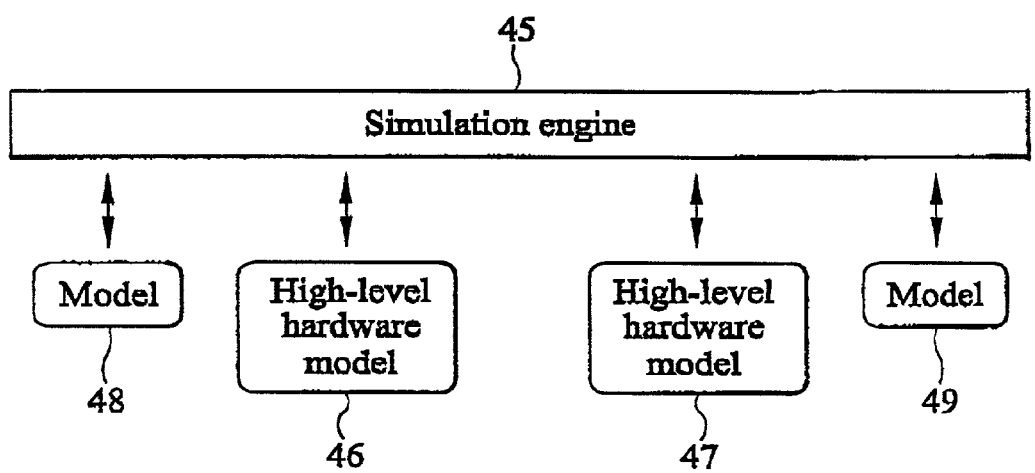
FIG. 5 shows the simulation of the system description using a simulation engine with means for the simulation models to communicate with the simulation engine.

The simulation mechanism involves the generation of simulation models from the component model descriptions and then co-simulating them using a simulation engine. As shown in FIG. 5, the simulation engine 45 communicates with simulation models 46 to 49 which correspond to the descriptions 41 to 44, respectively, of FIG. 3.

The high-level hardware models are described in a language based on the CSP model of computation. FIG. 6 shows that each of these models comprises a number of sequential processes 11 to 16 communicating with each other using synchronous channels. The processes 11 to 16 can communicate with external resources using synchronous channels, or by accessing devices 18 to 19. In this embodiment, the devices are registers, RAMs and ROMs, but in general this method applies to any I/O devices (e.g. displays, sensors, etc). The devices (18, 19) can be internal (in the model) or external (in the environment). The model can also provide access to a number of its internal devices to the environment.

Figure 4:
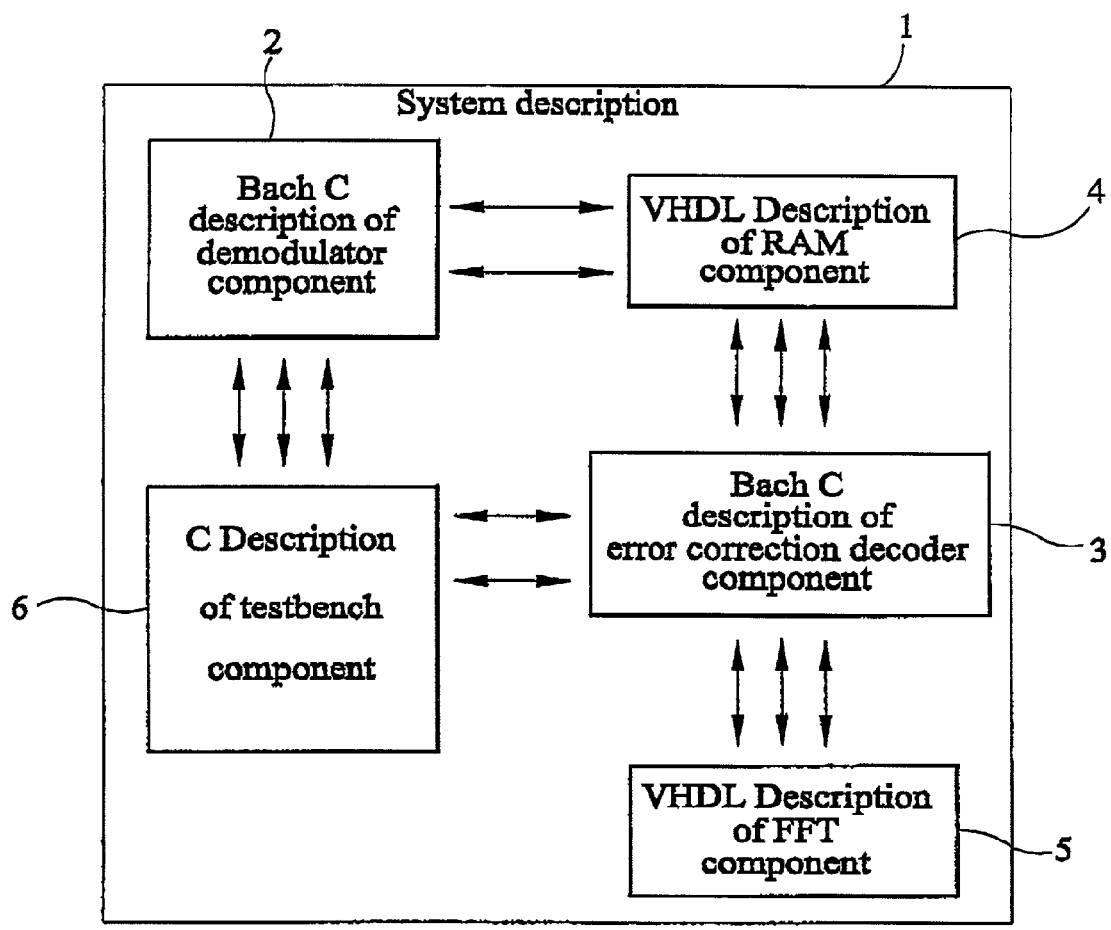
FIG. 4 shows a specific example of a system description comprising component model descriptions communicating with each other and with some component models described in the Bach C high-level language.
Figure 9:
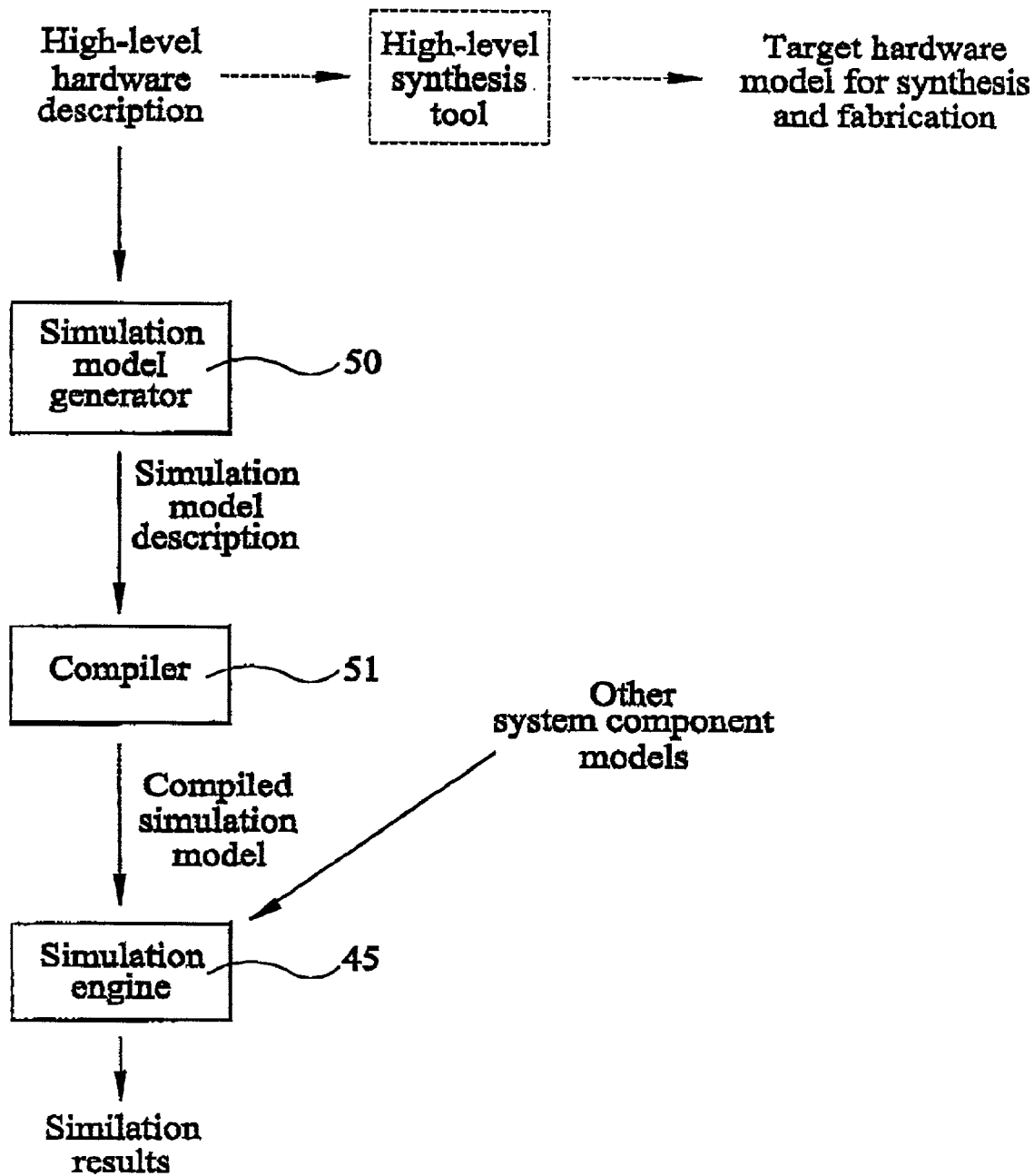
FIG. 9 illustrates the overall method used for generating the simulation model using a simulation model generator, a compiler and a simulation engine.
Figure 10:
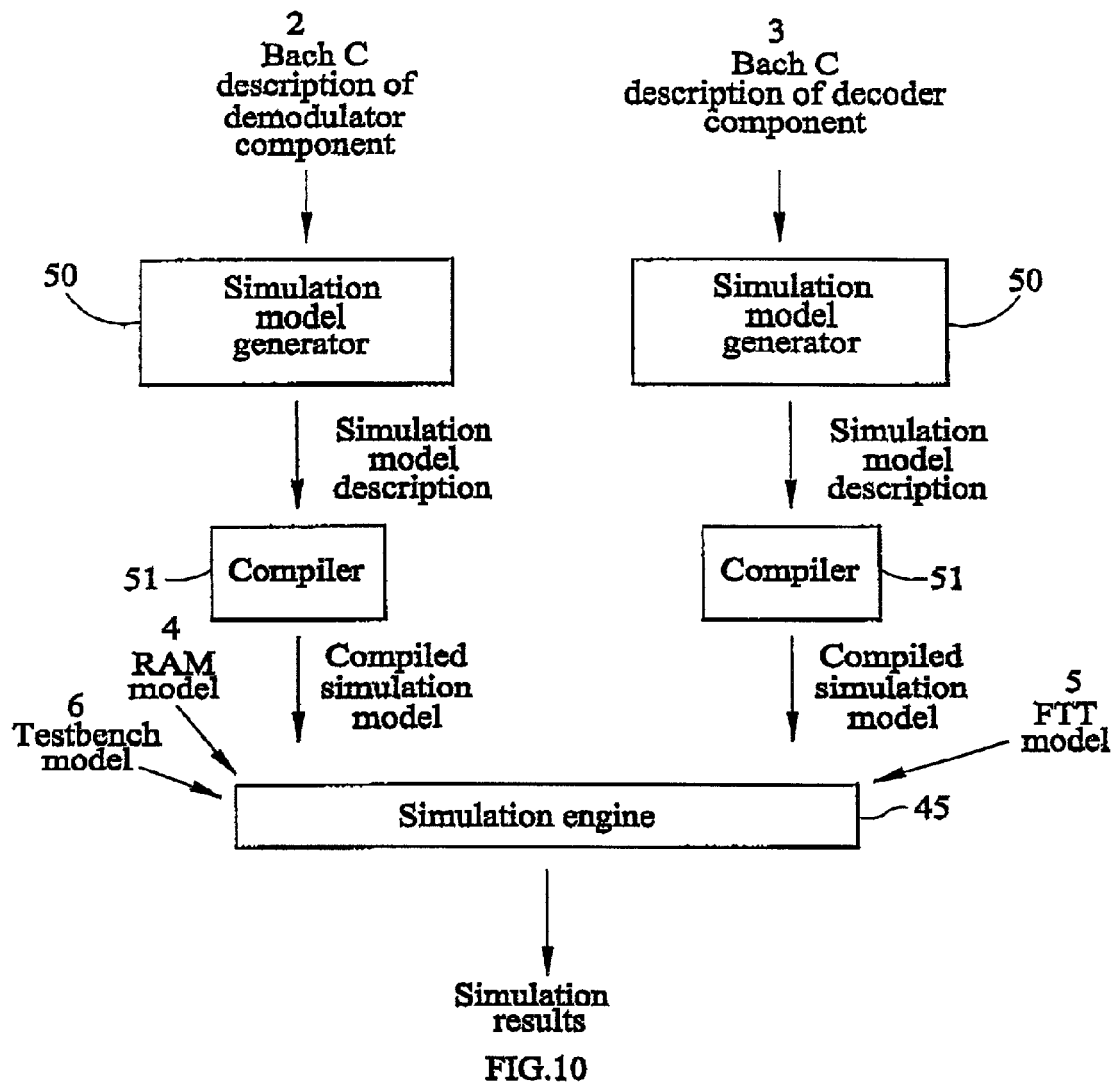
FIG. 10 illustrates the overall method used for generating the simulation model for the particular example shown in FIG. 4.

A high-level CSP model describes a hardware component. An example of the target hardware component model 20 is shown in FIG. 7. This model has ports to represent the external synchronous communication channels and access to the internal and external devices. The target model 20 represents a synchronous hardware component and therefore includes ports for external clocks. Other ports for initialising the circuit and for reporting its internal status are included. In this embodiment, we use the example of a reset port which resets the circuit to an initial state and a finish port which reports whether the circuit is at the final state or not. The simulation model which will be used for co-simulation should have the same behaviour as the target hardware model (which is used for synthesis and fabrication), As shown in FIG. 9, the mechanism for generating the simulation model comprises a simulation model generation unit 50 and a compiler 51. The model generation unit 50 takes the high-level model description and returns a simulation model description. The automatically generated simulation model is described in a standard imperative language such as C. The simulation model is then compiled using a standard compiler 51 for the language used to describe the generated model. An illustration of this method on the specific example shown in FIG. 4 is shown in FIG. 10.

The co-simulation method requires a simulation engine 45, and a means for the system component models 2 to 6 to communicate with the simulation engine 45. An example of such means is described in U.S. Pat. No. 5,335,191, the contents of which are incorporated herein by reference. When using such communication means, the simulation model is activated by a number of stimuli and takes a number of inputs and returns a number of outputs as illustrated in FIG. 8.

Figure 11:
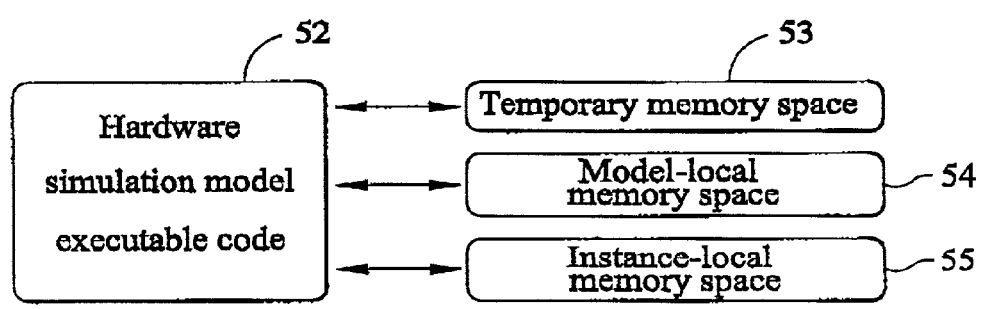
FIG. 11 shows three kinds of storage that the simulation model can access.

Like any other computer code, the code 52 of the compiled simulation model uses data stored in memory. FIG. 11 illustrates that the simulation model uses three Rinds of data storage:

(a) Temporary storage 53: the data stored here can be accessed quickly.
(b) Model-Local storage 54: the data stored here has fast access as well, but it is used by all instances of the same simulation model.
(c) Instance-Local storage 55: this storage is allocated individually for every simulation model instance. Access to this storage is more computationally expensive than the access to the temporary and model-local storage 53, 54.

An instance-local data object called the execution mode is used by all simulation models. This data can have one of the following values:

(1) Uninitialised: the simulation model has not been initialised by the reset signal yet.
(2) Running: the simulation model has been initialised and has not reached the final state.
(3) Finished: the simulation model has reached its final state.

When the simulation model is created, the initial value of the execution mode is Uninitialised. We say that the uninitialised flag is set. Similarly we say that the running flag or the finished flag is set depending on the value of the execution mode.

FIG. 12 shows the structure of the generated simulation model. This model comprises the initiallsation unit 24, the finishing unit 25, and several stimulus and response units 26, 27. The initialisation and finishing units 24, 25 perform a number of book-keeping tasks. For example the initialization unit 24 is responsible for fetching the instance-local storage when the simulation model is activated and the finishing unit 25 is responsible for recording the instance-local storage so that it can be retrieved later. The simulation model contains a stimulus unit 26 for each different kind of stimulus that can be accepted by the model. For every stimulus unit 26 there is a response unit 27. When the stimulus unit 26 detects a stimulus, it activates its associated response unit 27. The different Rinds of response units 27 include:

(a) a reset response unit which sets the internal state of the model to its initial value.
(b) internal devices response units which handle the internal devices.
(c) process response units which perform the actual behaviour described by the high-level hardware description and represent the processes of the high-level CSP model.

Figure 13:
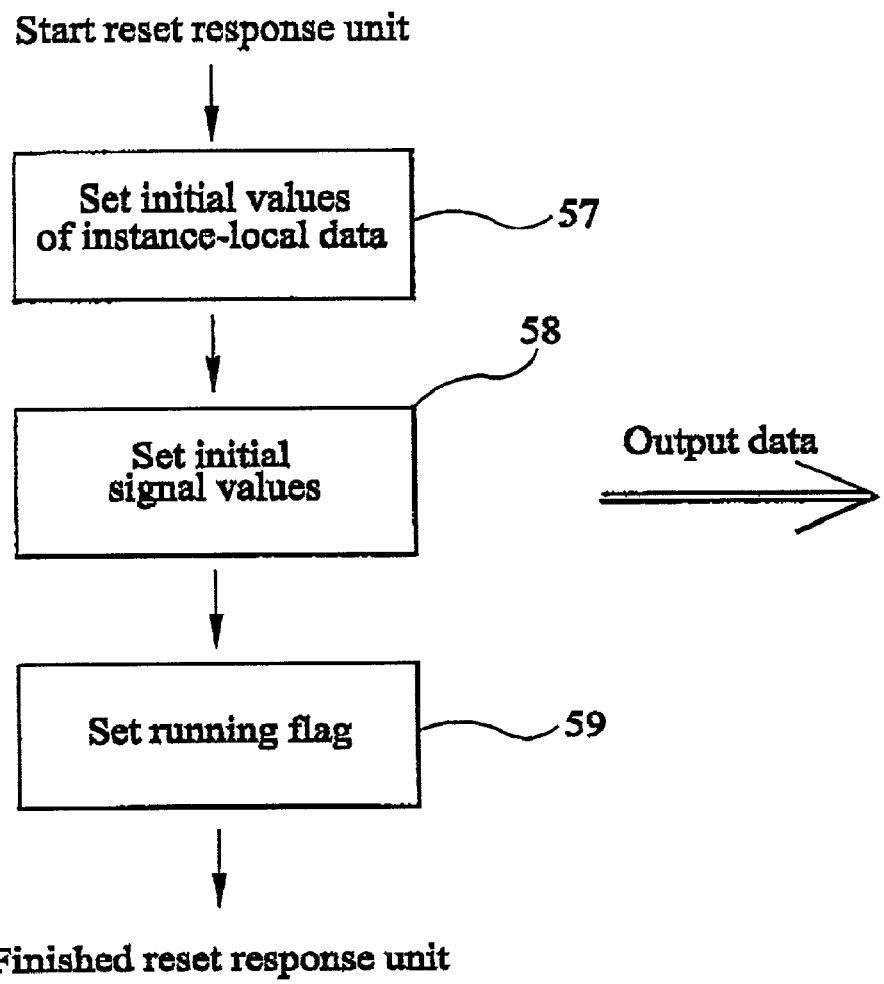
FIG. 13 shows the reset response unit of the simulation model.

FIG. 13 illustrates the reset response unit. When this unit is activated, it sets (57) the values of specific initial-local data to their initial value (as described in the high-level model). It also sets (58) the output port signals to their initial values as intended by the high-level description, for example setting all the external device interface and external communication ports so that the circuit is not accessing external devices or trying to communicate with external resources. It then sets the running flag 59 to indicate that the model has been initialised. The corresponding stimulus unit of the reset response unit checks whether the reset port has the active value.

Figure 14:
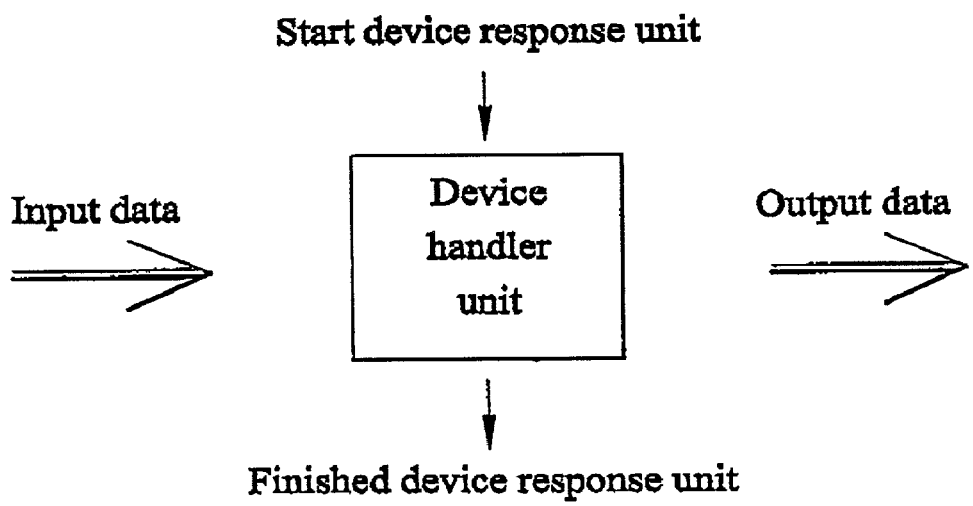
FIG. 14 shows the internal device response unit of the simulation model.

The internal device response units comprise device handlers 60 which model the appropriate behaviour of the devices whenever they are activated as shown in FIG. 14. The corresponding stimulus units either check whether the values of the input ports have been changed in the case of asynchronous devices or check the appropriate clock edges in the case of synchronous devices.

Figure 15:
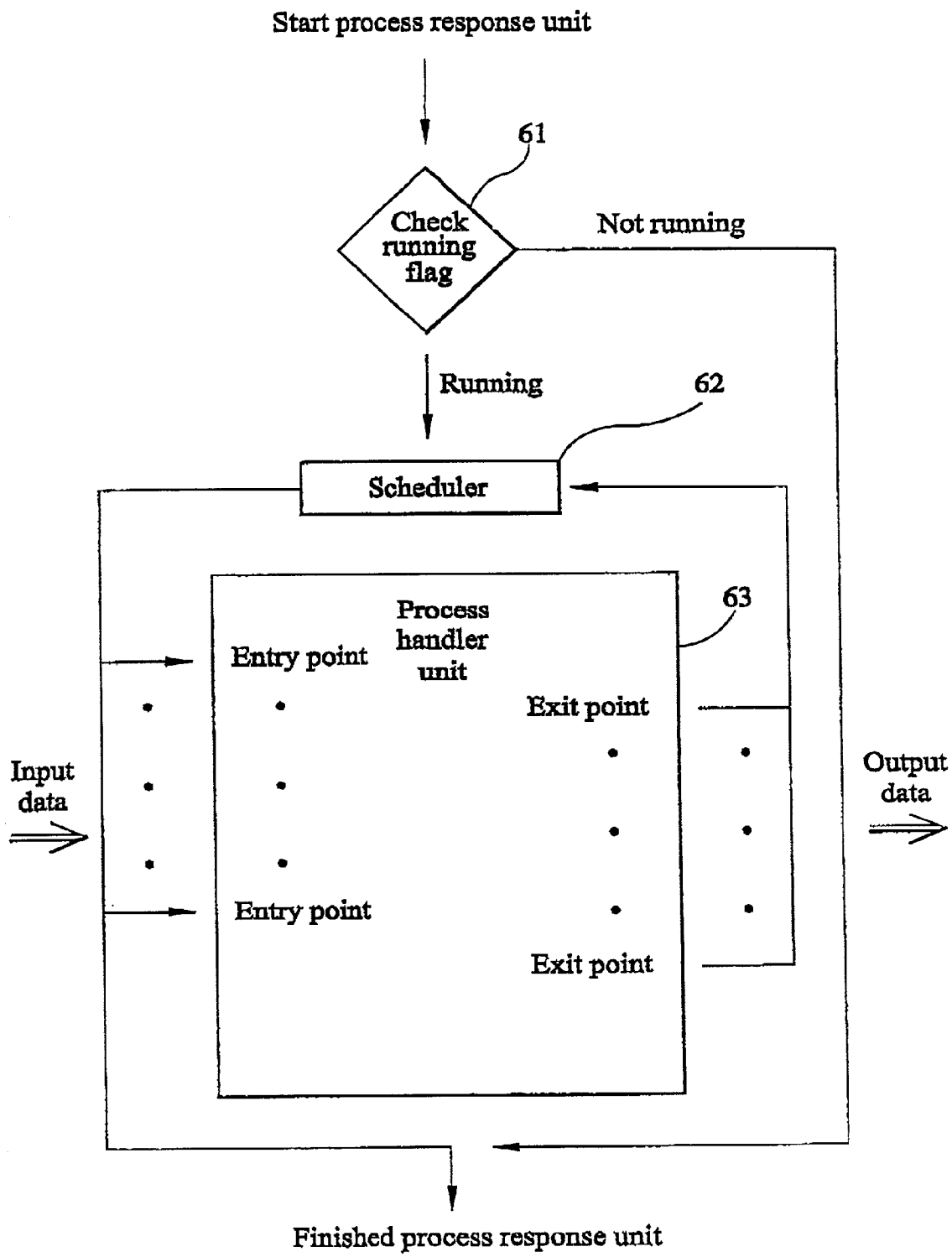
FIG. 15 shows the process response unit of the simulation model.

The process response units handle all the model processes that are stimulated by the same clock. In the case of a single clock target model, all the processes of the model are handled by the same process response unit. FIG. 15 shows the structure of a process response unit which comprises a mechanism 61 for checking the running flag, a scheduler 62 and a process handler unit 63. The scheduler 62 takes care of the parallelism described in the high-level hardware model. The process handler unit 63 represents the behaviour of the associated processes. A number of locations to the process handler code are called entry points and are locations in which the scheduler can transfer execution. Another number of locations in the process handler code are called exit points and are locations from which execution can be transferred back to the scheduler. The scheduler 62 decides on an appropriate entry point in the process handler unit 63. The process handler unit 63 is then executed until an exit point is reached, in which case execution returns to the scheduler 62. The stimulus units corresponding to process response units check the appropriate clock edges.

Figure 16:
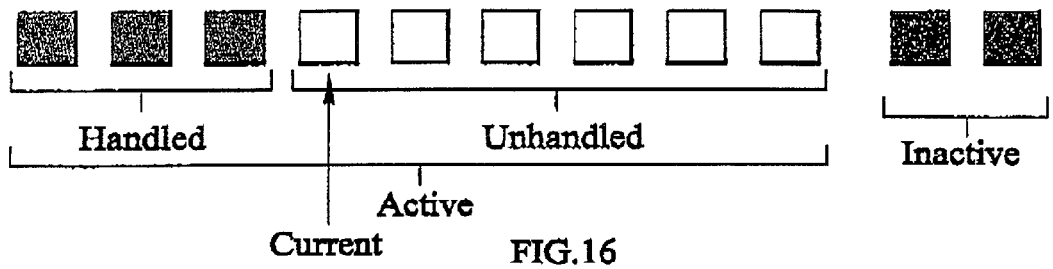
FIG. 16 shows a process list used by the scheduler of the simulation model.

The scheduler 62 decides on an entry point in the process handler unit 63 by using a process list as shown in FIG. 16. The process list is stored in instance-local storage and comprises a list of process records. Each process record contains the following information a process identifier; status information; and an entry point location. No two process records in a process list can have the same identifier. The status information indicates whether a process is running or not, and whether it has already been handled by the scheduler 62 or not. Therefore, the process status is either active (also called running) or inactive (also called sleeping). The scheduler 62 ensures that all the active processes are handled at least once, and that each scheduling stage exits after a finite amount of time. In this embodiment, the scheduler 62 handles each active process exactly once.

A different approach is to repeat the scheduling mechanism a finite number of times, or until the process list becomes empty.

The mechanism for handling each active process exactly once is as follows: Active processes can either be handled or unhandled. One of the active unhandled processes is called the current process.

The scheduler should be able to perform these functions:
(1) Set all active processes as unhandled.
(2) Check whether there are active unhandled processes in the process list.
(3) Select an active unhandled process as the current process.
(4) Find the entry point of a given process.
(5) Set the current process as handled and set its entry point to a given location.
(6) Deactivate the current process and set its entry point to a given location.
(7) Remove the current process from the process list.
(8) Activate a specific inactive process.
(9) Create a new active process and select it as the current process.
(10) Create a new unhandled process and set its entry point to a given location.

Figure 17:
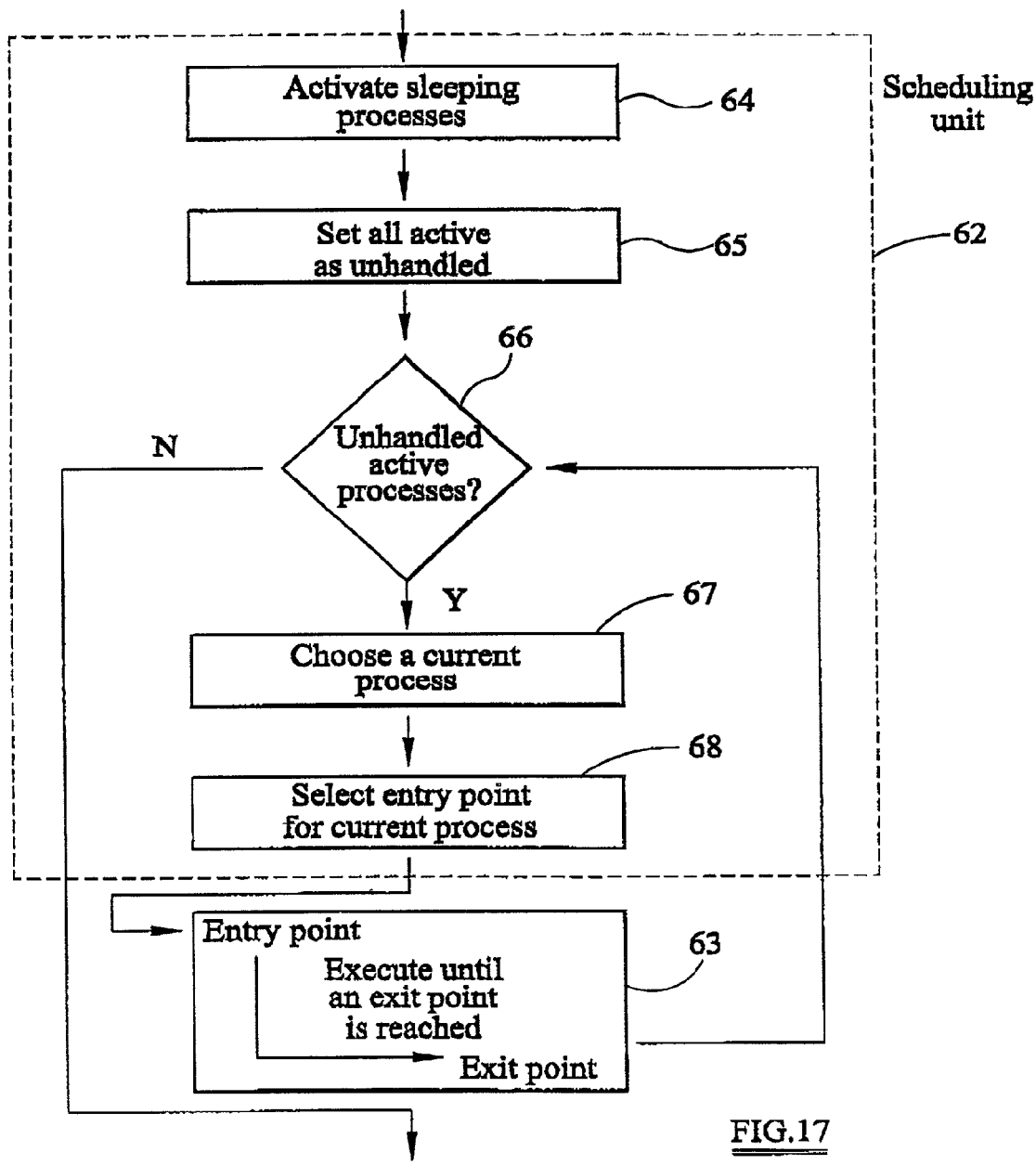
FIG. 17 shows a mechanism used for scheduling and selecting the current entry point.

FIG. 17 illustrates the scheduling mechanism used for selecting an entry point in the process handler unit 63. The scheduler 62 starts by activating 64 a number of sleeping processes, depending on the input values to the simulation model. For example, if a process was inactive because it was waiting for a specific input port value, then the scheduling mechanism tries to check this input port value and decide whether to activate the sleeping process or not. The active processes, if any, are then marked 65 as unhandled. The scheduler 62 checks 66 whether the process list contains any unhandled active processes, and selects 67 one of them as the current process. The entry point given in the current process record is then used 68. The execution of the process response unit is transferred to this entry point in the process handling unit, which keeps running until an exit point is reached. Note that the process handling unit 63 can use some of the scheduling functions and the current process is usually either set to unhandled, deactivated or removed from the process list just before the exit point is reached. At this point, execution returns to the scheduler 62 and a new current process and entry point are selected. This is repeated until no unhandled active processes are left in the process list.

This concludes the description of the simulation model which is generated automatically from the high-level hardware model. The following describes the simulator model generator 50 which. as illustrated in FIG. 9, is used to generate a simulation model description. The compiler 51 is then used to compile the model.

Figure 18:
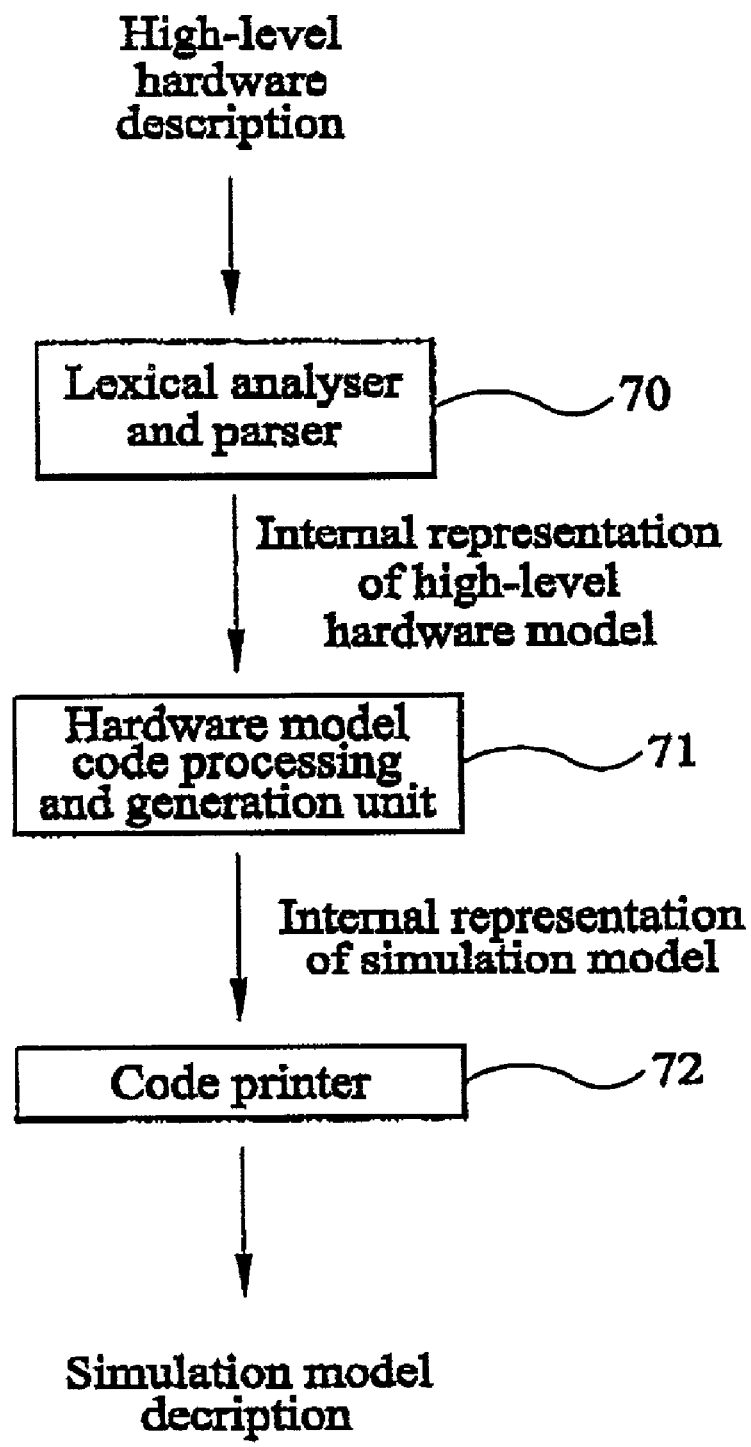
FIG. 18 shows a pre-compiled simulation model generation unit.

FIG. 18 shows that the simulation model generator comprises the main components usually used in standard compiler technology (see, for example, Alfred V. Aho, Ravi Sethi and Jeffery D. Ullman, "Compilers: Principles, Techniques, and Tools." Addison Wesley Publishing Company, October 1985):

(a) A lexical analyser and parser 70 which take the textual description of the high-level hardware model and generate an internal representation of the same.
(b) A hardware model code processing and generation unit 71 which takes the internal description of the high-level hardware model and generates an internal representation of the simulation model.
(c) A code printer 72, which generates a textual representation of the simulation model from its internal representation.

Figure 19:
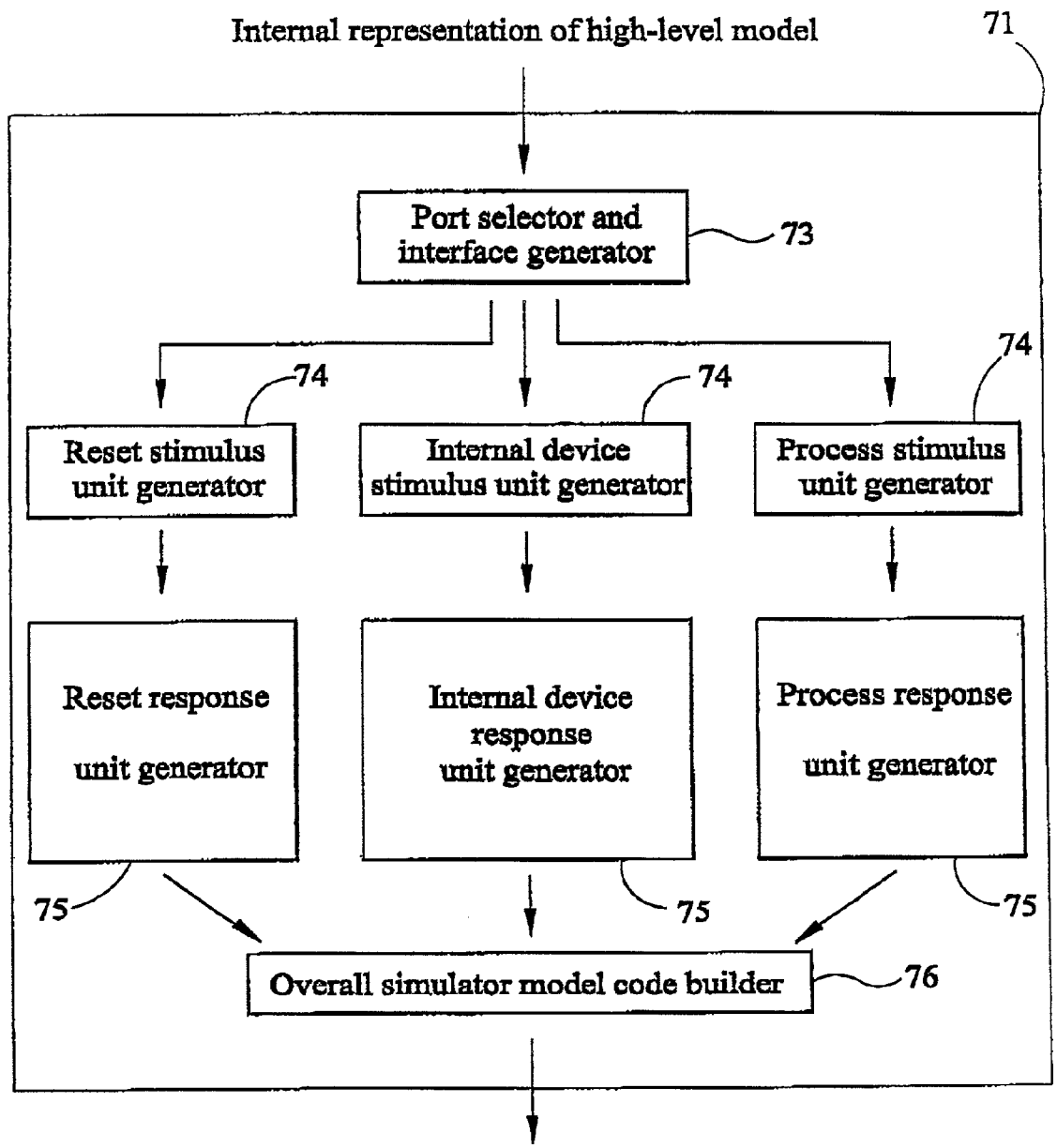
FIG. 19 shows a simulation model code processor and generator.

The simulation model generator uses standard technology for the lexical analyser and parser 70, and for the code printer 72. The hardware model code processing and generation unit. is shown in detail in FIG. 19 and comprises a port selector and interface generator 73, a stimulus unit generator 74 and a response unit generator 75 for all the different types of stimulus/response units and an overall simulator model code builder 76.

The port selector and interface generator 73 generates the interface of the simulation model from the interface of the high-level model. The interface of the high-level model describes the channels that are used for external communication, the access given for internal devices, and the access required for external devices. The interface of the simulation model should be the same as the interface of the target hardware model 20 used for synthesis as shown in FIG. 7 and comprising the input and output ports of the model. The ports generated by the interface generator are as follows:

(1) Init/Status ports: a reset input port signal is used to reset the simulation model, and a finish output port is activated by the simulation model when the simulation model reaches its final state.

(2) External Channel Communication ports: these are used for synchronous communication with other system components and comprise a two-way handshake communication mechanism with one data port, and two handshaking ports: a sender_ready and a receiver_ready port. The communication is synchronised when both the sender_ready and receiver_ready port signal ere active. At this point, data is transferred from the sender to the receiver through the data port.

(3) Internal Device Access ports: these ports correspond to the usual interface of device blocks. For example, an SRAM device will have the usual address and data bus ports, write-enable and read-enable ports, possibly write-acknowledge and read-acknowledge ports, and a clock port if it is a synchronous RAM.

(4) External Device Access ports: again, these ports correspond to the usual interface of device blocks.

The overall simulation model code builder 76 generates the simulation model from its individual components generated by the stimulus and response unit generators 74, 75. FIG. 12 shows how the simulation model is constructed from the stimulus/response units 26, 27 together with initialisation and finishing units 24, 25. The initialisation and finishing units 24, 25 are trivial book-keeping units which depend on the simulation engine and the communication mechanism used between the simulation engine and the component models.

The reset response unit generator builds the reset response unit having the structure shown in FIG. 13. The block initialising the instance local data is generated by taking the initialisers from the internal representation of the hardware model and then generating the instructions required to initialise them. The block initialising the signal values is generated by taking the output ports selected by the interface generator and generating instructions to initialise them. The appropriate instruction(s) to set the running flag is then generated. The reset stimulus unit generator simply builds a unit which checks the value of the reset input port.

The internal device response unit generator lists all the internal devices that can be accessed by the environment and creates a response unit for each of them which simply models the standard behaviour of the device. The internal devices are represented in the simulation model by appropriate data structures: RAMs and ROMs are represented by arrays and registers are represented by instance local variables. The device response unit models the appropriate behaviour: read access to a RAM or ROM is modelled by array indexing; write access to a RAM is modelled by array element assignment; read access to a register is modelled by variable access; and write access to a register is modelled by variable assignment. The internal device stimulus unit generator creates the appropriate unit which either checks the appropriate clock signal value in the case of synchronous devices or a change in the input signal values in the case of asynchronous devices.

Figure 20:
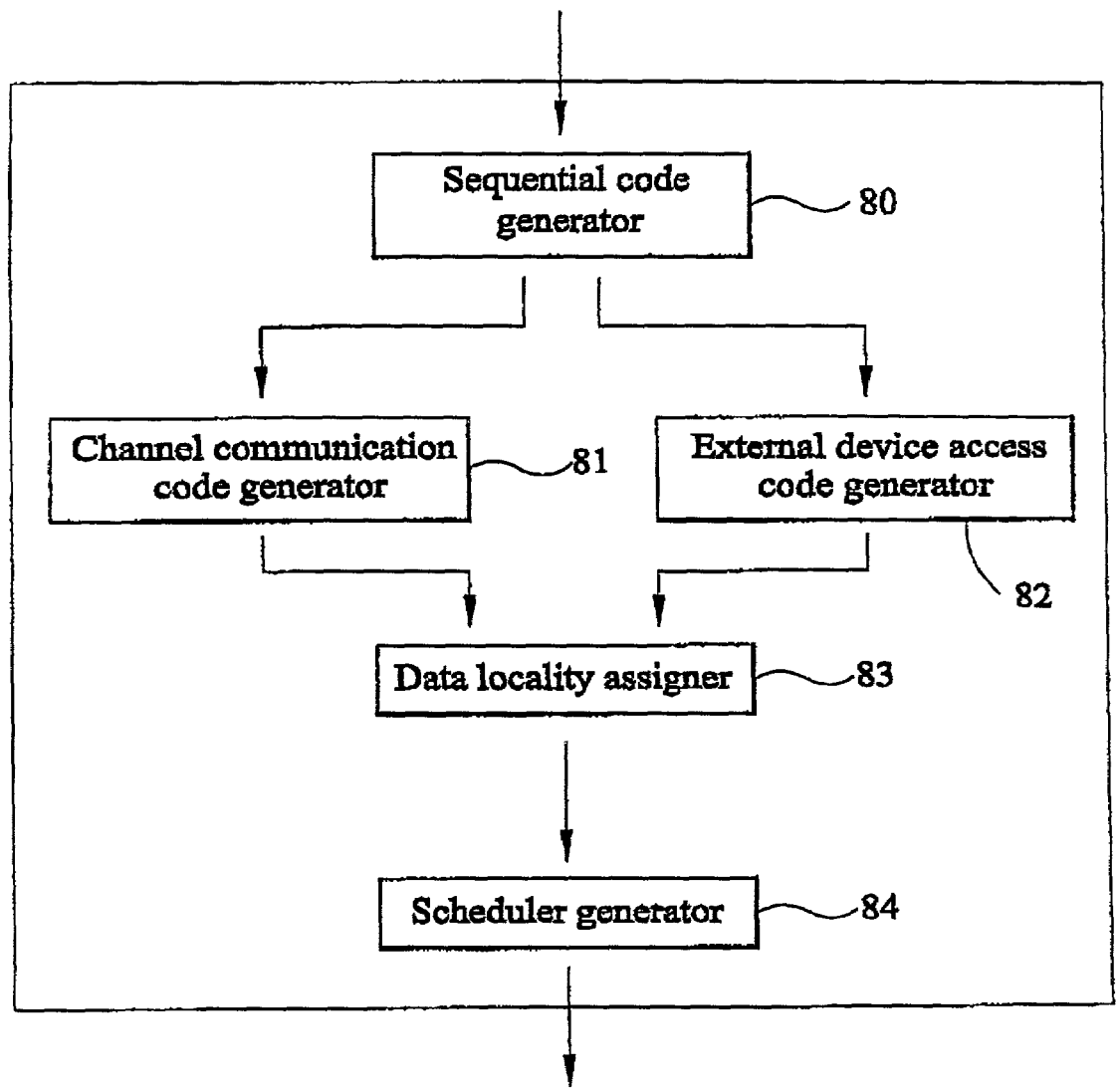
FIG. 20 shows a process response unit generator of the simulation model code processor and generator.

The main part of the model code processor and generator is the process response unit generator, which is shown in FIG. 20 and which comprises:

(a) a sequential code generator 80, responsible for creating a sequential version of the parallel algorithm given in the high-level model;

(b) A channel communication code generator 81, responsible for generating the instructions responsible for the communication between processes and the external environment;

(c) An external device access code generator 82, responsible for generating the instructions to access external devices correctly;

(d) A data locality assigner 83, responsible for assigning the appropriate locality to the data in the simulation model which represents the data in the high-level model.

(e) A scheduler generator 84, which generates the scheduling functions.

The sequential code generator 80 starts by analysing the internal representation of the high-level model and builds an internal description of the sequential code of the process handler unit shown in FIG. 15. When a communication instruction is encountered, the channel communication code generator 81 builds the appropriate instructions to model the communication. Similarly, when an external device access instruction is encountered, the external device access code generator 82 generates the appropriate instructions to perform the device access. The internal representation of the process handler unit is then analysed by the data locality assigner 83 in order to give an appropriate locality to each data item. Finally, the scheduler generator 84 takes the internal representation of the process handler unit 63 and generates the process response unit by creating the scheduler 62.

The sequential code generator 80 builds the required sequential code by analysing the structure of the high-level model. The high-level model is based on a parallel algorithm and is therefore composed from sequential instructions by parallel composition and sequential constructs such as sequential composition and loops. With the exception of communication and external device access, the individual (atomic) sequential instructions in the high-level model can be used to generate the sequential instructions in the simulation model using some known method. Examples of these atomic instructions include arithmetic expressions and assignments. Given this method we now show how the structure of the high-level model is used to build the required sequential code. We therefore show how code composed by:

(1) Sequential Composition;
(2) Parallel Composition;
(3) Loops is treated to generate the sequential code in the process handler unit.

Figure 21:
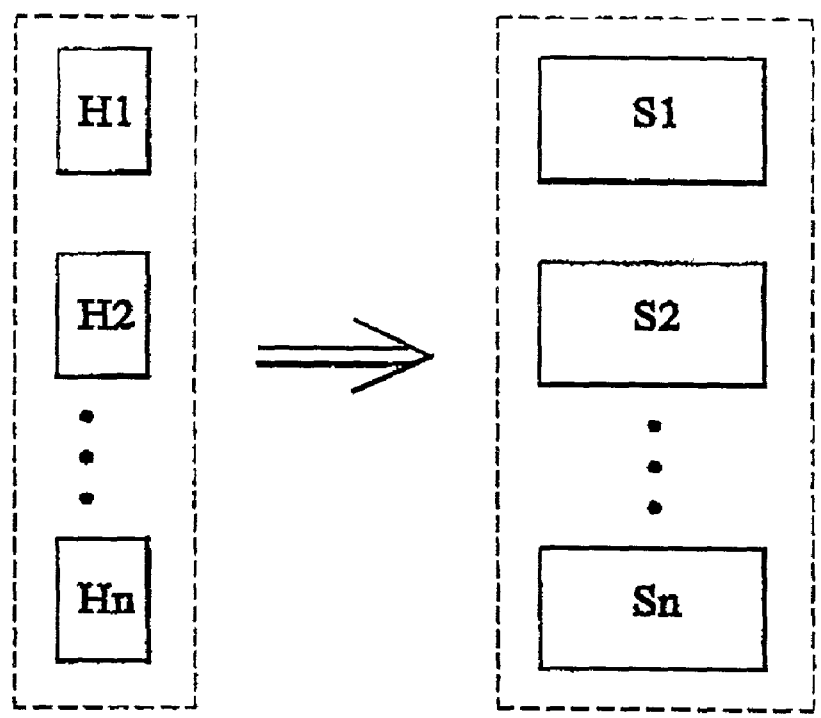
FIG. 21 shows the code generation of sequential composition.

Sequential Composition is treated very simply, as shown in FIG. 21. If a process consists of several processes: H1, H2, . . . , Hn sequentially composed together, then the required sequential code is generated by:

(a) generating the sequential code S1, S2, . . . , Sn for each of the processes H1, H2, . . . , Hn (b) Building the required sequential code by composing S1, S2, . . . , Sn sequentially in the right order.

Figure 22:
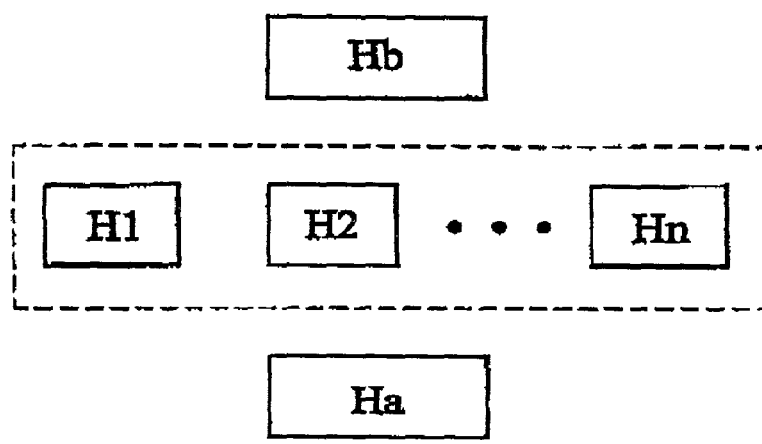
FIG. 22 illustrates parallel composition.
Figure 23:
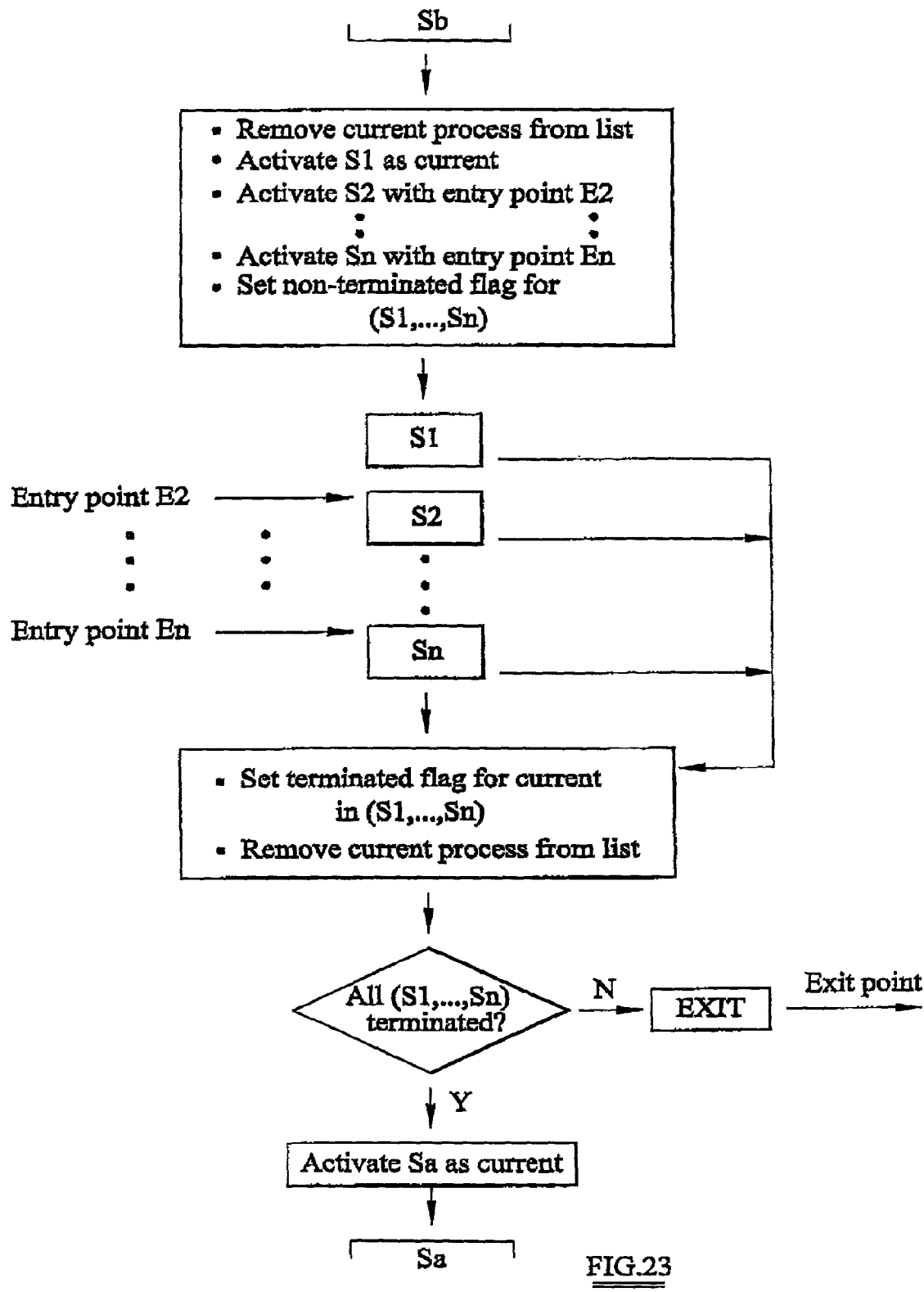
FIG. 23 shows the code generated from parallel composition.

Parallel Composition is treated in a more complex way. FIG. 22 shows a process composed of a number of processes H1, H2, . . . , Hn in parallel. For ease of explanation, we assume that this process is then composed sequentially between Hb and Ha. FIG. 22 shows the resulting sequential code which is generated from the blocks of sequential code S1, S2, . . . , Sn and other instructions. The blocks S1, S2, . . . , Sn are the sequential code blocks generated from the high-level processes H1, H2, . . . , Hn. Similarly, Sb and Sa are generated from the processes Hb and Ha. The following points about the generated sequential code should be noted:

(1) Each of the blocks S1, S2, . . . , Sn with the exception of Sn is followed by a jump instruction to the block starting with "setting terminated flag". Block Sn does not need such a jump instruction.

(2) A new process for each of the sequential blocks S1, S2, . . . , Sn is created. These are also called S1, S2, . . . , Sn here. Similarly, the process names Sb and Sa are used.

(3) Each of the blocks S2, . . . , Sn is labelled with an entry point. The generated sequential code contains one exit point.

(4) Apart from the blocks S1, S2, . . . , Sn, the sequential code also contains calls to a number of scheduler functions, and the following three kinds of instructions:
  (i) setting non-terminated flag for a number of processes;
  (ii) setting terminated flag for the current process in a number of processes;
  (iii) checking whether all the processes in a given number of processes have the terminated flag.

These instructions are used for the synchronisation mechanism required to start executing the code in Sb only after all the code in S1, S2, . . . , Sn has been executed. These instructions are explained below.

For each list of processes S1, S2, . . . , Sn representing a list of high-level processes composed in parallel, an instance local data structure called the terminating flags is generated. This data structure is used to indicate that all the processes have just been activated, to indicate that one of them (the current) has just been deactivated, and to check whether all of them have been deactivated. There are several easy and cheap ways to implement these instructions. An example is to use an integer i for the data structure, and then:
  (a) setting non-terminating flag for S1, . . . , Sn is implemented by setting the value of i to n
  (b) setting terminating flag for current in S1, . . . , Sn is implemented by decrementing the value of I
  (c) checking whether all S1, . . . , Sn have terminated is implemented by checking whether i is 0.

Figure 24:
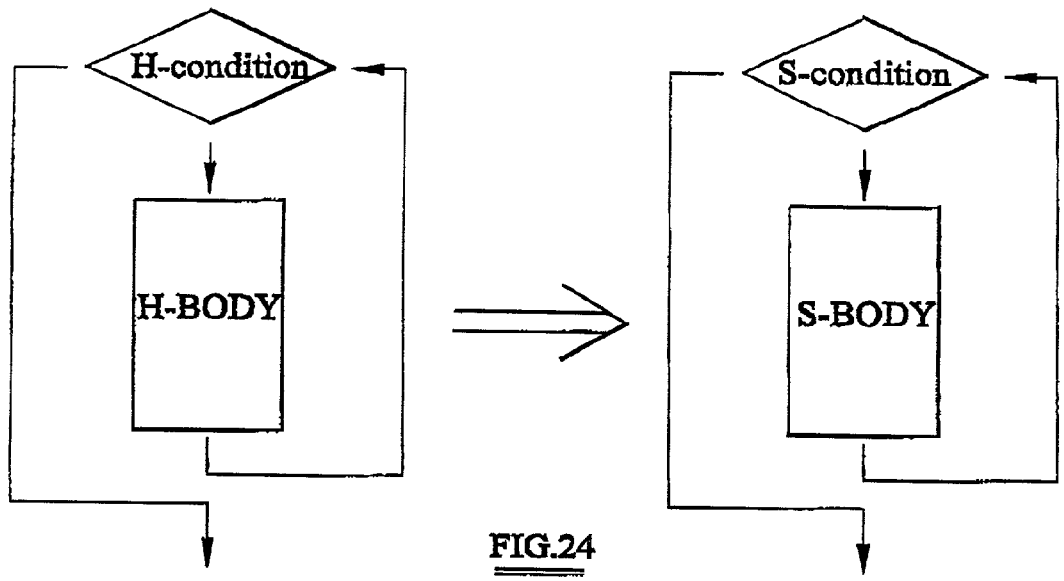
FIG. 24 shows the code generation of loops that definitely terminate.
Figure 25:
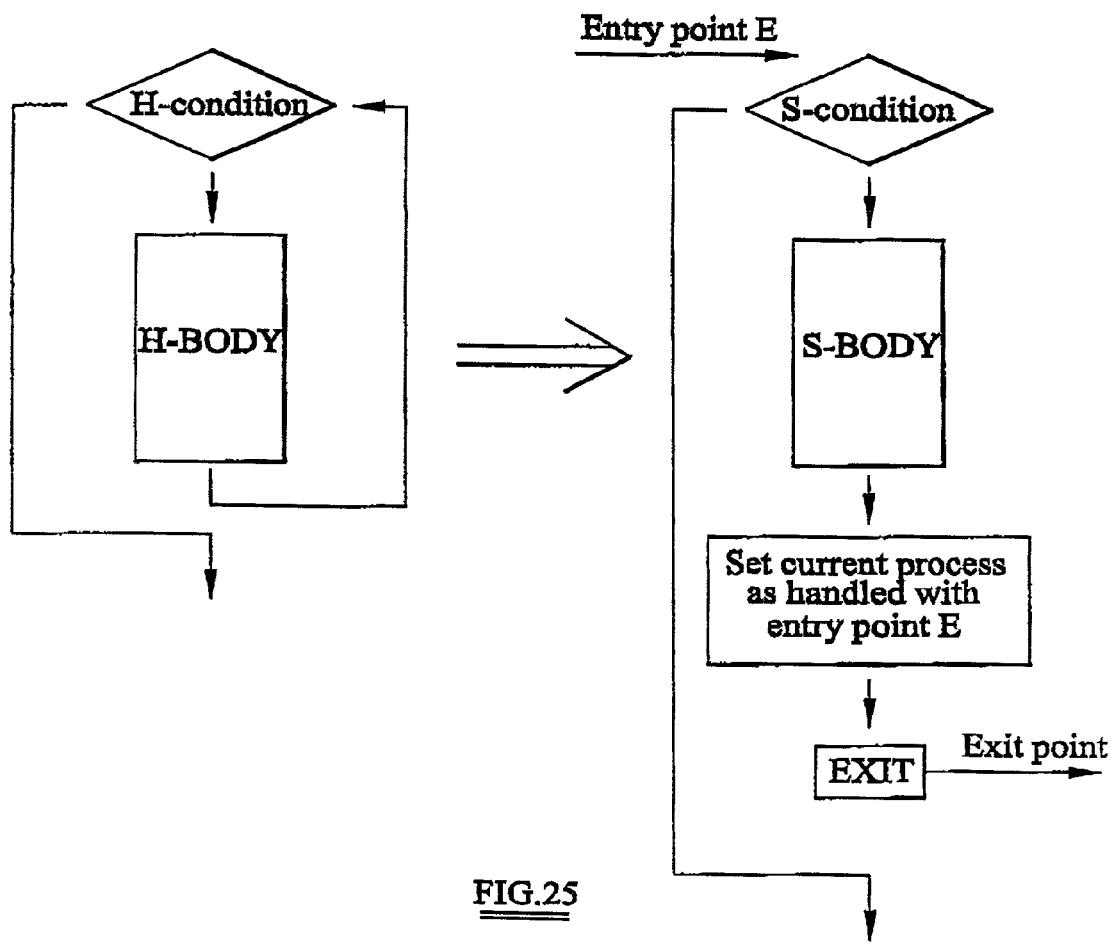
FIG. 25 shows the code generation of loops that may not terminate.

In general loops consist of an expression to check the termination condition of the loop, and the body of the loop. The sequential code generator:
  (1) generates the sequential code for the termination condition (which we can call the S-condition) from the high-level code for the same condition (which we can call the H-condition). It also generates the sequential code for the loop body (S-body) from the high-level code of the body (H-body).
  (2) Analyses the loop to check whether it is possibly non-terminating, or whether it definitely terminates. Methods for checking whether a loop definitely terminates include:
    (a) checking whether the loop represents a standard for loop (that is, a counter is set to an initial value, the terminating condition checks whether the counter has reached a max/minvalue, and the counter IB Increased/decreased monotonically at each execution of the loop body).
    (b) checking whether every execution of the S-body reaches an exit point.
  (3) If a loop definitely terminates, then a similar loop is created by replacing the H-condition with the S-condition, and the H-body with the S-body. FIG. 24 shows this for the case of loops where the terminating condition is checked before the execution of the loop.
  (4) If a loop may not terminate, then the beginning of the loop is marked with an entry point, and the jump instruction used for repeating the loop is replaced by an exit point and an instruction to set the current process as handled. An example of this is shown in FIG. 25.

After generating the internal representation of the simulation model, the sequential code generator 80 adds the instruction(s) to set the finish output signal to active, and to set the finished flag at the end of the code of the model.

The channel communication code generator 81 generates the instructions to model the inter-process communication constructs. Standard methods used for sequentialising CSP-based parallel algorithms can be used to model the communication between two internal processes. We therefore concentrate on the description of the method used for modelling the communication between an internal process and the external environment. The interface for external communications channels is assumed to contain a receiver_ready signal, a sender_ready signal, and a data signal and data is transferred when both the receiver_ready and sender_ready signals are active.

For each external channel c in the high-level model, an instance local variable c-process is generated. This variable can contain the process identifier for each process in the simulation model, together with the value none. The none value is also the initial value of the c-process variable. The none value is used to represent the state where no process is waiting for data to be transferred through the channel c. A value corresponding to an identifier for a process p is used to represent the state where the process p is waiting for data to be transferred through channel c.

The channel communication code generator 81 generates two blocks of code for each communication instruction. One block is inserted in the process handler unit 63 and replaces the communication instruction in the high-level model. The other block is appended to the block in the scheduling unit 62 that activates sleeping processes as shown in FIG. 17.

We consider the two communication instructions: sending a value through an external channel, receiving a value through an external channel.

Figure 26:
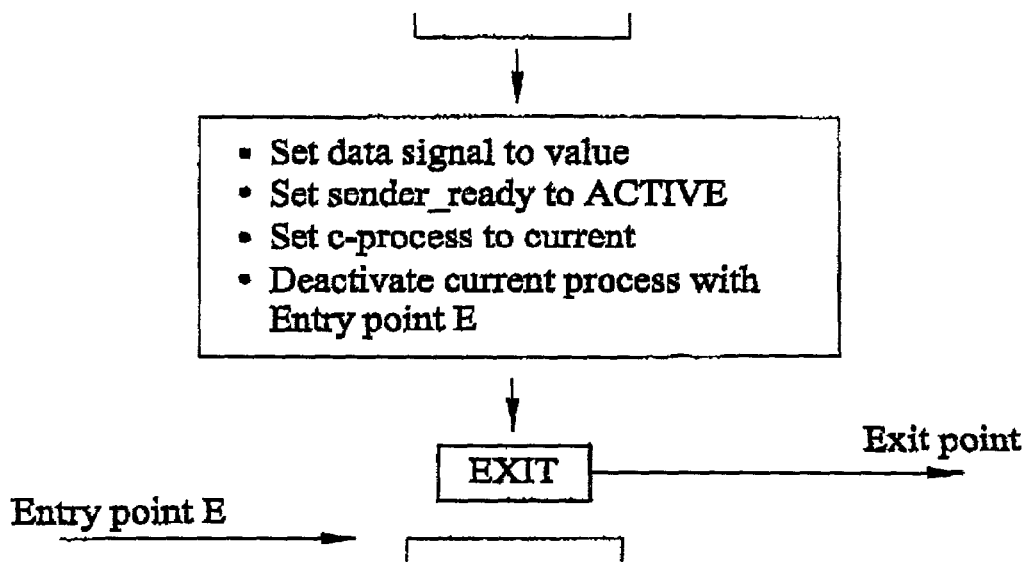
FIG. 26 shows the generated code for sending value through an external channel.
Figure 27:
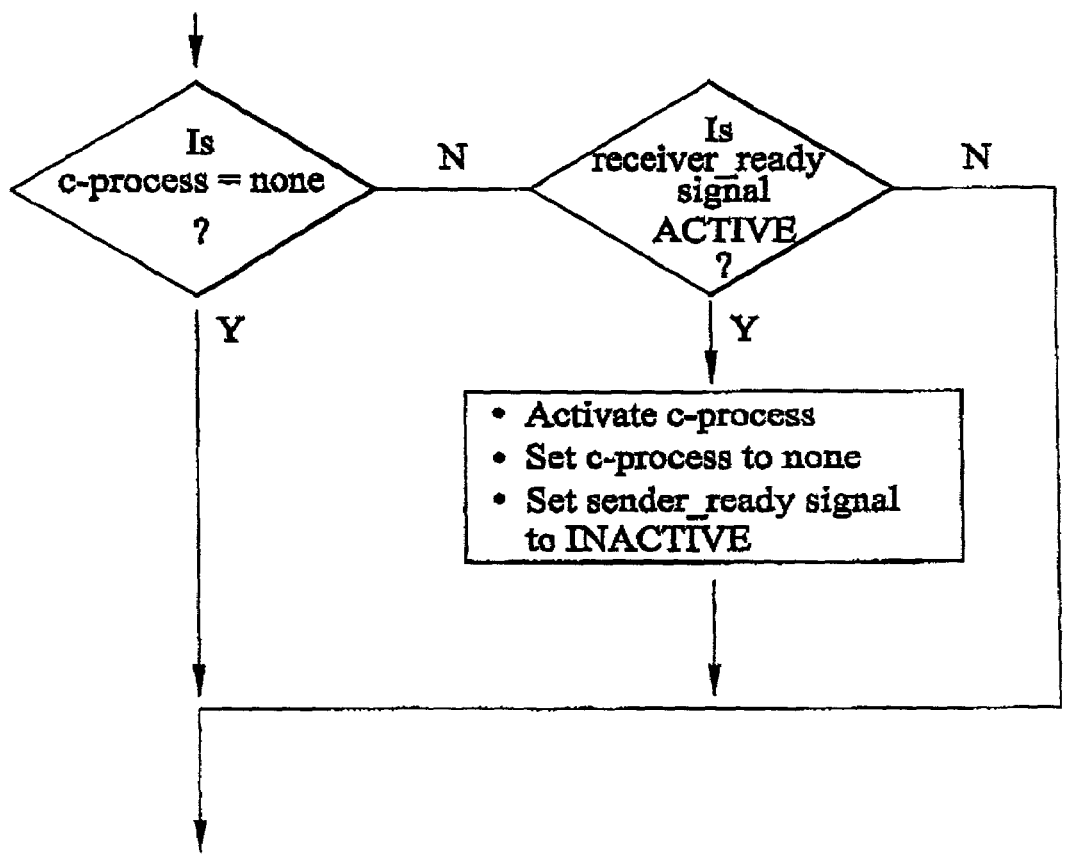
FIG. 27 shows a block for activating a process waiting for data to be sent through an external channel.

A communication instruction to send a value through an external channel c is replaced by the code shown in FIG. 26, which transfers the value through the data channel sets the sender_ready signal to high sets the c-process variable to the current process and then deactivates the current process and exits. The code which re-activates the process after data has been received is shown in FIG. 27 and is inserted in the activate sleeping processes block of the scheduling unit. The code shown in FIG. 27 checks whether a process is waiting for data to be transferred through the channel a and whether the receiver_ready signal is active in which the waiting process in the c-process is activated, Betting the c-process variable back to none and the sender_ready signal back to inactive.

Figure 28:
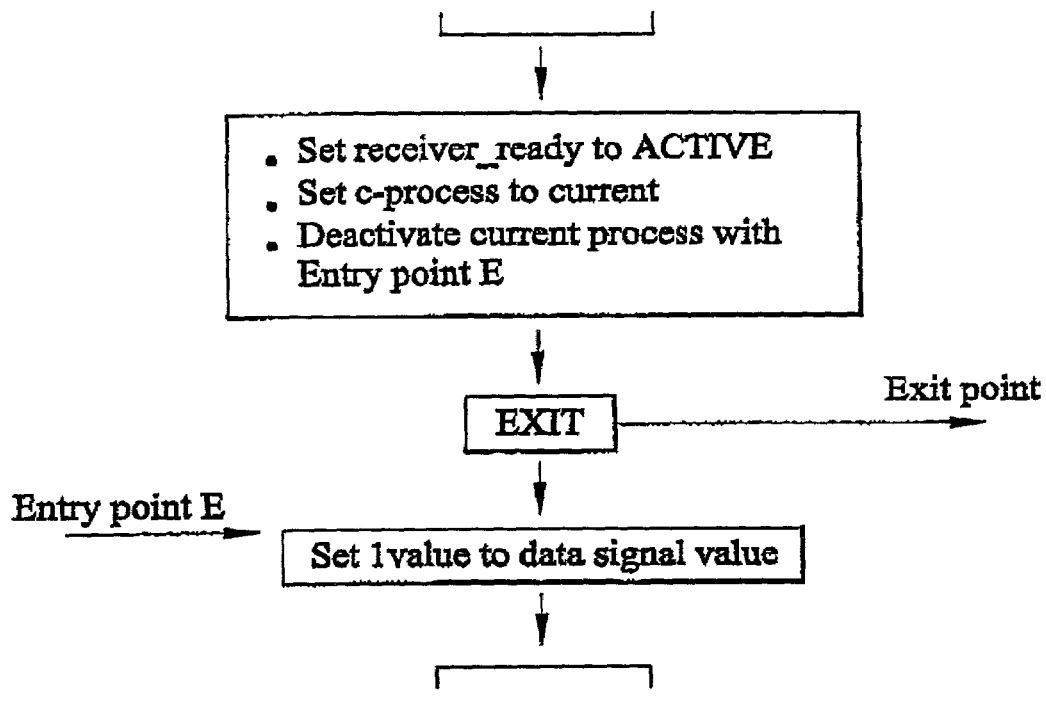
FIG. 28 shows the generated code for receiving value through an external channel.
Figure 29:
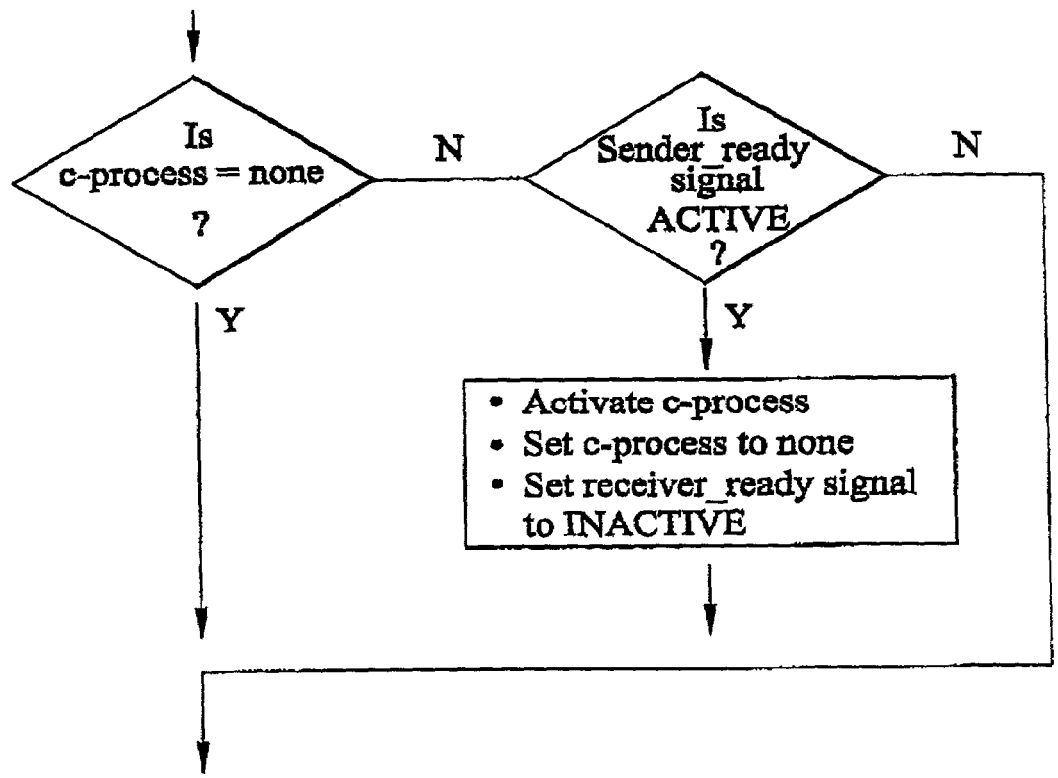
FIG. 29 shows a block for activating a process waiting for data to be received through an external channel.

A communication instruction to receive a value through an external channel c is replaced by the code shown in FIG. 28. We assume that the transferred value is to be stored in a storage location given by lvalue. The generated code sets the receiver_ready signal to high, sets the c-process variable to the current process and then deactivates the current process and exits. When the process is activated again, it receives the value from the data signal and stores it in lvalue. The code which re-activates the process after data has been received is shown in FIG. 29 and is inserted in the activate sleeping processes block of the scheduling unit. The code shown in FIG. 29 checks whether a process is waiting for data to be transferred through the channel c and whether the sender_ready signal is active, in which case the waiting process in c-process is activated, setting the c-process variable back to none and the receiver_ready signal back to inactive.

The external device access code generator 82 builds Similar blocks to handle external device access, and these are not described in detail here. Basically, an instance local variable is used to check whether a process is waiting for the effect of the device access or not. The external device access code generator 82 replaces the device access instruction in the high-level model with a block of code in the process handler unit 63 which sets the appropriate signals to perform the device access and then sets the value of the process to the current process, deactivates the current process, and then exits When this processes is activated again, the generated code uses the effect of the device access (if any) appropriately. Also, the external device access code generator 82 generates a block of code to check whether the effect of the device access occurred and then re-activates the process waiting for this effect. This code block is appended to the activate sleeping processes block of the scheduling unit.

Figure 30:
FIG. 30 shows the criterion used for assigning instance local locality to data in the simulation model.

The locality assigner 83 assigns one of the following three localities to the data in the simulation model representation that represent the data in the high-level model representation:
(i) temporary,
(ii) model local,
(iii) instance local The locality assigner 83 assigns the model local locality to all constant data; for example to the data representing the values of ROM devices. Instance local locality is given to data that is written before an entry point, and then read after an entry point, as illustrated in FIG. 30. The rest are then given the temporary locality if they represent local high-level model data or the model local locality if they represent global high-level model data. This method as used by the locality assigner 83 reduces the number of instance local data since they are the most expensive to access.

The scheduler generator 84 performs the following two actions:
(1) It generates the code for the scheduling functions. It is possible for anyone knowledgeable in the art to design efficient implementations for these functions.
(2) It takes the process handler unit 63 generated by the other components of the model code processor and generator, and the block for activating the sleeping processes generated by the channel communication code generator 81 and the external devices access code generator 82 and then creates the scheduling unit 62 shown in FIG. 17.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method of co-simulating a digital circuit using a simulation engine which communicates with at least one first programming language by means of a foreign language interface and which communicates directly with at least one second programming or hardware description language, comprising the steps of:
    (a) providing at least one first model of at least one first part of the digital circuit in at least one high-level hardware description language which supports concurrent processes communicating with each other:
    (b) converting the at least one first model to at least one software model in the at least one first programming language, wherein converting includes generating, for at least one discrete process, software code including a program loop having a jump instruction and a loop termination condition, and analyzing the loop termination condition to determine whether it is not automatically determined to be definitely terminating and, if so, replacing the jump instruction with an exit point;
    (c) providing at least one second model of at least one second part of the digital circuit in the at least one second language; and
    (d) applying the at least one software model in the at least one first language and the at least one second model in the at least one second language to the simulation engine, so as to perform a simulation in order to obtain a simulation result.

2. A method as claimed In claim 1, in which the converting step (b) comprises compiling the at least one first model in the at least one high-level hardware description language to the at least one software model in the at least one first language.

3. A method as claimed in claim 1, in which the at least one high-level hardware description language is based on a communicating sequential processes model.

4. A method as claimed in claim 1, in which the at least one first part of the digital circuit is represented in the at least one high-level hardware description language as a plurality of concurrent processes which communicate with each other and the converting step (b) comprises converting the concurrent processes to a sequential software process.

5. A method as claimed in claim 4, in which the software process comprises at least one stimulus unit for detecting a predetermined stimulus and at least one response unit for providing a predetermined response in response to the at least one stimulus unit.

6. A method as claimed In claim 5, in which at least one of the response units comprises a process response unit for performing a desired behaviour of the at least one first part of the digital circuit.

7. A method as claimed in claim 6, wherein the at least one discrete process is a plurality of discrete processes, and in which the desired behaviour comprises the plurality of discrete processes triggered by a common event and the process response unit comprises a scheduler for scheduling the discrete processes, and a process handler for performing the discrete processes in accordance with the scheduling.

8. A method as claimed in claim 7, in which the scheduler: forms a list of active unhandled processes having respective exit points; chooses from the list a current process; and selects an entry point for the current process.

9. A method as claimed in claim 8, in which, at each exit point, the scheduler chooses from the list a further current process and selects a further entry point for the further current process.

10. A method as claimed in claim 9, in which the converting step (b) comprises: the scheduler placing at the exit point the at least one discrete process in the list of active unhandled processes with a new entry point.

11. A method as claimed in claim 8, in which the converting step (b) comprises: the scheduler placing at the exit point the at least one discrete process in the list of active unhandled processes with a new entry point.

12. A method of designing a digital circuit, the steps performed by a co-simulation system comprising:
    performing a method as claimed in claim 1,
    checking whether the result of the co-simulation is correct
    checking whether the digital circuit is synthesisable, and
    generating a low-level hardware description of the digital circuit.

13. A method of manufacturing a digital circuit, comprising performing a method as claimed in claim 12 and forming, from the low-level hardware description, an integrated circuit including the digital circuit.

14. An apparatus for co-simulating a digital circuit using a simulation engine which communicates with at least one first programming language by means of a foreign language interface and which communicates directly with at least one second programming or hardware description language, comprising:
   a processor and memory; and
   code stored in the memory and executable by the processor,
   wherein when at least one first model of at least one first part of the digital circuit in at least one high-level hardware description language which supports concurrent processes communicating with each other is provided to the processor, the code executed by the processor causes the processor to convert the at least one first model to at least one software model in the at least one first programming language, wherein for at least one discrete process, software code is generated including a program loop having a jump instruction and a loop termination condition, and analyzing the loop termination condition to determine whether it is possibly non-terminating and, if so, replacing the jump instruction with an exit point; and
   wherein when at least one second model of at least one second part of the digital circuit in the at least one second language is provided to the processor, the processor applies the at least one software model in the at least one first language and the at least one second model in the at least one second language to the simulation engine.

15. An apparatus as claimed in claim 14, comprising a computer programmed by a computer program.

16. A system for co-simulating a digital circuit using a simulation engine which communicates with at least one first programming language by means of a foreign language interface and which communicates directly with at least one second programming or hardware description language, comprising:
   a processor circuit having a processor and a memory;
   computer code stored in the memory and executable by the processor, the computer code comprising:
      code that converts at least one first model of at least one first part of the digital circuit in at least one high-level hardware description language which supports concurrent processes communicating with each other to at least one software model in the at least one first programming language when the at least one first model is provided to the processor circuit;
      code that generates, for at least one discrete process, software code including a program loop having a jump instruction and a loop termination condition, and analyzing the loop termination condition to determine whether it is possibly non-terminating and, if so, replacing the jump instruction with an exit point; and
      code that applies the at least one software model in the at least one first language and at least one second model of at least one second part of the digital circuit in the at least one second language to the simulation engine.

17. A program embodied in a computer-readable medium for co-simulating a digital circuit using a simulation engine which communicates with at least one first programming language by means of a foreign language interface and which communicates directly with at least one second programming or hardware description language, comprising:
   code that converts at least one first model of at least one first part of the digital circuit in at least one high-level hardware description language which supports concurrent processes communicating with each other to at least one software model in the at least one first programming language when the at least one first model is provided to the processor circuit;
   code that generates, for at least one discrete process, software code including a program loop having a jump instruction and a loop termination condition, and analyzing the loop termination condition to determine whether it is possibly non-terminating and, if so, replacing the jump instruction with an exit point; and
   code that applies the at least one software model in the at least one first language and at least one second model of at least one second part of the digital circuit in the at least one second language to the simulation engine.

* * * * *